(12) United States Patent
Cai

(10) Patent No.: US 11,585,872 B2
(45) Date of Patent: Feb. 21, 2023

(54) MAGNETIC SENSOR, MAGNETIC ENCODER, AND LENS POSITION DETECTION DEVICE

(71) Applicant: TDK CORPORATION, Tokyo (JP)

(72) Inventor: Yongfu Cai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 175 days.

(21) Appl. No.: 17/203,140

(22) Filed: Mar. 16, 2021

(65) Prior Publication Data

US 2021/0325486 A1 Oct. 21, 2021

(30) Foreign Application Priority Data

Apr. 20, 2020 (JP) .............................. JP2020-074675

(51) Int. Cl.
*G01R 33/09* (2006.01)
*G01D 5/245* (2006.01)
*G01D 5/14* (2006.01)

(52) U.S. Cl.
CPC ........... *G01R 33/093* (2013.01); *G01D 5/145* (2013.01); *G01D 5/2451* (2013.01)

(58) Field of Classification Search
CPC .... G01R 33/0094; G01R 33/02; G01R 33/06; G01R 33/09–098; G01D 5/12; G01D 5/14–145; G01D 5/245; G01D 5/2451
See application file for complete search history.

(56) References Cited

U.S. PATENT DOCUMENTS

| | | | | |
|---|---|---|---|---|
| 5,982,171 A | * | 11/1999 | Umemoto | G01D 5/147 324/252 |
| 2004/0000903 A1 | | 1/2004 | Morimoto | |
| 2009/0184706 A1 | * | 7/2009 | Durie | B82Y 25/00 324/228 |
| 2011/0025318 A1 | * | 2/2011 | Saruki | G01R 33/0023 324/252 |
| 2011/0025319 A1 | * | 2/2011 | Saruki | G01R 33/0029 324/252 |
| 2014/0139213 A1 | * | 5/2014 | Cadugan | G01R 33/0023 324/252 |
| 2015/0042319 A1 | | 2/2015 | Furuichi et al. | |
| 2015/0253162 A1 | | 9/2015 | Kusumi et al. | |
| 2020/0003846 A1 | * | 1/2020 | Masuda | G01R 33/0041 |

FOREIGN PATENT DOCUMENTS

| | | |
|---|---|---|
| EP | 2267413 A1 | 12/2010 |
| JP | 2004-37121 A | 2/2004 |
| JP | 2013-242299 A | 12/2013 |
| WO | 2009/031558 A1 | 3/2009 |

OTHER PUBLICATIONS

Apr. 5, 2022 Office Action issued in Japanese Patent Application No. 2020-074675.

* cited by examiner

*Primary Examiner* — Huy Q Phan
*Assistant Examiner* — David B Frederiksen
(74) *Attorney, Agent, or Firm* — Oliff PLC

(57) ABSTRACT

A magnetic sensor includes a first resistor having a first resistance and a first correction resistor having a second resistance. The first resistor and the first correction resistor are connected in series. The first resistor is configured so that the first resistance changes periodically as strength of a magnetic field component changes periodically. The first correction resistor is configured so that a change in a sum of the first resistance and the second resistance due to a noise magnetic field is smaller than a change in the first resistance due to the noise magnetic field.

17 Claims, 17 Drawing Sheets

MAGNETIC SENSOR, MAGNETIC ENCODER, AND LENS POSITION DETECTION DEVICE

BACKGROUND OF THE INVENTION

1. Field of the Invention

The present invention relates to a magnetic sensor, and a magnetic encoder and a lens position detection device that use the magnetic sensor.

2. Description of the Related Art

A magnetic encoder using a magnetic sensor is used to detect the position of a movable object whose position changes in a predetermined direction. The predetermined direction is a straight direction or a rotational direction. The magnetic encoder used to detect the position of the movable object is configured so that the position of a magnetic field generator, such as a magnetic scale, relative to the magnetic sensor changes within a predetermined range depending on the change in the position of the movable object.

As the position of the magnetic field generator relative to the magnetic sensor changes, the strength of a component of a target magnetic field, which is generated by the magnetic field generator and applied to the magnetic sensor, in one direction changes. For example, the magnetic sensor detects the strength of the component of the target magnetic field in one direction, and generates two detection signals that correspond to the strength of the component in the one direction and have respective difference phases. The magnetic encoder generates a detection value having a correspondence with the position of the magnetic field generator relative to the magnetic sensor on the basis of the two detection signals.

A magnetic sensor including a plurality of magnetoresistive elements is used as the magnetic sensor for the magnetic encoder. For example, WO 2009/031558 and EP 2267413 A1 disclose a magnetic sensor in which a plurality of giant magnetoresistive (GMR) elements are arranged as the magnetoresistive elements in a direction of relative movement between a magnet and the magnetic sensor and a direction orthogonal to the direction of relative movement.

In the magnetic encoder, a noise magnetic field other than the target magnetic field can be applied to the magnetic sensor aside from the target magnetic field. Examples of the noise magnetic field include the geomagnetic field and a leakage magnetic field from a motor. If a noise magnetic field is thus applied to the magnetic sensor, the magnetic sensor detects a composite magnetic field of the target magnetic field and the noise magnetic field. For example, if the strength of the noise magnetic field is constant over time, the strength of a component of the noise magnetic field in the one direction appears as an offset to the detection signals. As a result, an error occurs in the detection value.

US 2015/0253162 A1 discloses a position detection device using a magnetic scale. The position detection device includes two magnetic sensors that detect a recording signal of the magnetic scale as signals of sinusoidal waveform, two magnetic sensors that detect signals indicating a component corresponding to noise independent of the wavelength of the signal recorded on the magnetic scale (signals indicating a DC component), and two subtractors that detect differences between the signals of sinusoidal waveform and the signals indicating the DC component. In this position detection device, signals from which a noise component is removed are obtained by the subtractors.

In the position detection device disclosed in US 2015/0253162 A1, in order to remove the noise component, the magnetic sensors for detecting the noise component and the subtractors for removing the noise component are needed in addition to the magnetic sensors for detecting the recording signal of the magnetic sensor. There has thus been a problem of complicated configuration.

SUMMARY OF THE INVENTION

An object of the present invention is to provide a magnetic sensor that can reduce the influence of a noise magnetic field with a simple configuration, and a magnetic encoder and a lens position detection device that use the magnetic sensor.

A magnetic sensor according to the present invention detects a target magnetic field including a magnetic field component in a first direction and a noise magnetic field other than the target magnetic field. The magnetic sensor according to the present invention includes a first resistor having a first resistance, a first correction resistor having a second resistance, a first port, and a second port. The first resistor and the first correction resistor are connected in series between the first port and the second port.

The first resistor is configured so that the first resistance changes periodically as strength of the magnetic field component changes periodically. The first correction resistor is configured so that a change in a sum of the first resistance and the second resistance due to the noise magnetic field is smaller than a change in the first resistance due to the noise magnetic field.

In the magnetic sensor according to the present invention, the first correction resistor may be configured so that a change in the second resistance due to the magnetic field component is smaller than a change in the first resistance due to the magnetic field component. The first correction resistor may be configured so that the change in the second resistance due to the magnetic field component is zero.

In the magnetic sensor according to the present invention, the first resistor and the first correction resistor may each include a plurality of magnetoresistive elements. The plurality of magnetoresistive elements may each include a magnetization pinned layer having a magnetization whose direction is fixed, a free layer having a magnetization whose direction is variable depending on the direction and strength of the magnetic field component, and a gap layer located between the magnetization pinned layer and the free layer. A direction of the magnetization of the magnetization pinned layer in each of the plurality of magnetoresistive elements of the first resistor may be a first magnetization direction. A direction of the magnetization of the magnetization pinned layer in each of the plurality of magnetoresistive elements of the first correction resistor may be a second magnetization direction opposite to the first magnetization direction.

If the first resistor and the first correction resistor each include a plurality of magnetoresistive elements, the plurality of magnetoresistive elements of the first correction resistor may be arranged in a row in the first direction at a predetermined interval. In such a case, a distance from a magnetoresistive element located at an end in the first direction to a magnetoresistive element located at the other end in the first direction among the plurality of magnetoresistive elements of the first correction resistor may be a distance equivalent to one to ten periods of a change in the strength of the magnetic field component.

If the first resistor and the first correction resistor each include a plurality of magnetoresistive elements, the number of the plurality of magnetoresistive elements of the first resistor may be greater than or equal to the number of the plurality of magnetoresistive elements of the first correction resistor.

If each of the first resistor and the first correction resistor includes a plurality of magnetoresistive elements, each of the plurality of magnetoresistive elements may further include a bias magnetic field generator that generates a bias magnetic field in a direction intersecting the first direction, the bias magnetic field being applied to the free layer. Alternatively, the free layer may have magnetic shape anisotropy with a direction of an easy axis of magnetization intersecting the first direction.

If each of the first resistor and the first correction resistor includes a plurality of magnetoresistive elements, the gap layer may be a tunnel barrier layer.

The magnetic sensor according to the present invention may further includes a second resistor having a third resistance, a second correction resistor having a fourth resistance, and a third port located between the first resistor and first correction resistor and the second port. The second resistor and the second correction resistor may be connected in series between the second port and the third port. The second resistor may be configured so that the third resistance changes periodically as the strength of the magnetic field component changes periodically, and so that a change in the third resistance has a phase different from a phase of a change in the first resistance. The second correction resistor may be configured so that a change in a sum of the third resistance and the fourth resistance due to the noise magnetic field is smaller than a change in the third resistance due to the noise magnetic field. In such a case, the first port may be a power supply port to which a voltage of predetermined magnitude is applied. The second port may be a ground port that is grounded.

A magnetic encoder according to the present invention includes the magnetic sensor according to the present invention, and a magnetic field generator that generates the target magnetic field. The magnetic sensor and the magnetic field generator are configured so that the strength of the magnetic field component changes with a change in a position of the magnetic field generator relative to the magnetic sensor.

The magnetic encoder according to the present invention may further include a detection value generation circuit. In such a case, the magnetic sensor may generate at least one detection signal having a correspondence with the magnetic field component. The detection value generation circuit may generate a detection value having a correspondence with the position of the magnetic field generator relative to the magnetic sensor on the basis of the at least one detection signal.

In the magnetic encoder according to the present invention, the magnetic field generator may be a magnetic scale including a plurality of pairs of N and S poles alternately arranged in a predetermined direction. In such a case, the at least one detection signal may contain an ideal component varying periodically to trace an ideal sinusoidal curve, and an error component corresponding to a harmonic of the ideal component. The first resistor may be configured to reduce the error component.

A lens position detection device according to the present invention is intended to detect a position of a lens whose position is variable. The lens position detection device according to the present invention includes the magnetic sensor according to the present invention, and a magnetic field generator that generates the target magnetic field. The lens is configured to be movable in the first direction. The magnetic sensor and the magnetic field generator are configured so that the strength of the magnetic field component changes with a change in the position of the lens.

The lens position detection device according to the present invention may further include a detection value generation circuit. In such a case, the magnetic sensor may generate at least one detection signal having a correspondence with the magnetic field component. The detection value generation circuit may generate a detection value having a correspondence with the position of the lens on the basis of the at least one detection signal.

In the lens position detection device according to the present invention, the magnetic field generator may be a magnetic scale including a plurality of pairs of N and S poles alternately arranged in a predetermined direction. In such a case, the at least one detection signal may contain an ideal component varying periodically to trace an ideal sinusoidal curve, and an error component corresponding to a harmonic of the ideal component. The first resistor may be configured to reduce the error component.

In the magnetic sensor, the magnetic encoder, and the lens position detection device according to the present invention, the first resistor is configured so that the first resistance changes periodically as the strength of the magnetic field component changes periodically. The first correction resistor is configured so that a change in the sum of the first resistance and the second resistance due to the noise magnetic field is smaller than a change in the first resistance due to the noise magnetic field. According to the present invention, the influence of the noise magnetic field can thus be reduced with a simple configuration.

Other and further objects, features and advantages of the present invention will appear more fully from the following description.

DETAILED DESCRIPTION OF THE PREFERRED EMBODIMENTS

First Embodiment

Figure 1:
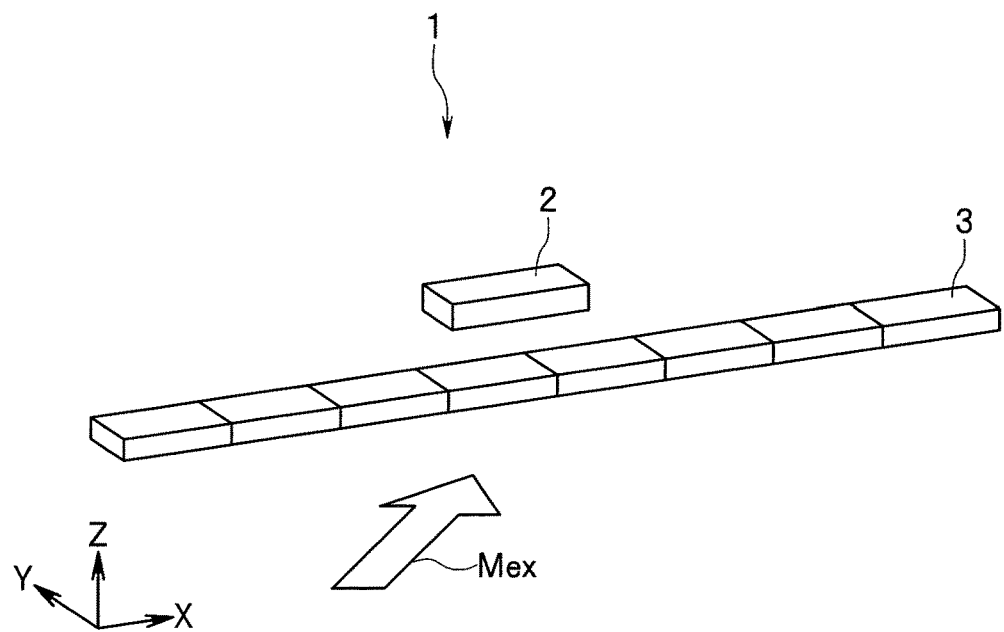
FIG. 1 is a perspective view showing a magnetic encoder according to a first embodiment of the invention.
Figure 2:
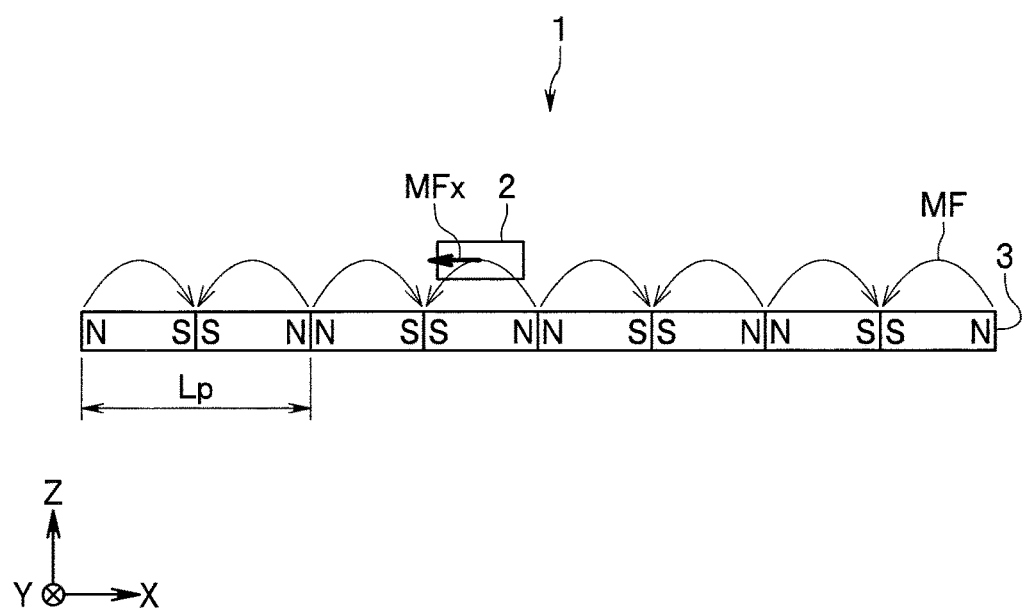
FIG. 2 is a front view showing the magnetic encoder according to the first embodiment of the invention.

Preferred embodiments of the present invention will now be described in detail with reference to the drawings. A schematic configuration of a magnetic encoder according to a first embodiment of the present invention will initially be described with reference to FIGS. 1 and 2. FIG. 1 is a perspective view showing a magnetic encoder 1. FIG. 2 is a front view showing the magnetic encoder 1. The magnetic encoder 1 includes a magnetic sensor 2 according to the present embodiment and a magnetic field generator 3.

The magnetic field generator 3 generates a target magnetic field MF that is a magnetic field for the magnetic sensor 2 to detect (magnetic field to be detected). The target magnetic field MF includes a magnetic field component in a direction parallel to an imaginary straight line. The magnetic sensor 2 and the magnetic field generator 3 are configured so that the strength of the magnetic field component changes with a change in the position of the magnetic field generator 3 relative to the magnetic sensor 2. The magnetic sensor 2 detects the target magnetic field MF including the magnetic field component, and generates at least one detection signal corresponding to the strength of the magnetic field component.

The magnetic field generator 3 may be a magnetic scale including a plurality of pairs of N and S poles alternately arranged in a predetermined direction. The magnetic scale may be a magnetic medium, such as a magnetic tape, that is alternately magnetized to a plurality of pairs of N and S poles. The magnetic scale may be a plurality of magnets arranged along the foregoing predetermined direction. The magnetic sensor 2 or the magnetic field generator 3 is movable within a predetermined range along the predetermined direction. As the magnetic sensor 2 or the magnetic field generator 3 moves, the position of the magnetic field generator 3 relative to the magnetic sensor 2 changes. The predetermined direction may be a linear direction or a rotational direction.

In the present embodiment, the magnetic field generator 3 is a linear scale magnetized to a plurality of pairs of N and S poles in a linear direction. The magnetic sensor 2 or the magnetic field generator 3 is movable along the longitudinal direction of the magnetic field generator 3. As shown in FIG. 2, the distance between two N poles adjoining in the longitudinal direction of the magnetic field generator 3 (the same as the distance between two S poles adjoining in the longitudinal direction of the magnetic field generator 3) will be referred to as one pitch. The size of one pitch will be denoted by the symbol Lp.

Now, we define X, Y, and Z directions as shown in FIGS. 1 and 2. In the present embodiment, a direction parallel to the longitudinal direction of the magnetic field generator 3 will be referred to as an X direction. Two mutually orthogonal directions perpendicular to the X direction are referred to as the Y and Z directions. In FIG. 2, the Y direction is shown as a direction from the near side to the far side of FIG. 2. The opposite directions to the X, Y, and Z directions will be referred to as −X, −Y, and −Z directions, respectively.

The magnetic sensor 2 is located away from the magnetic field generator 3 in the Z direction. The magnetic sensor 2 is configured to be able to detect the strength of a magnetic field component MFx of the target magnetic field MF at a predetermined position in a direction parallel to the X direction. For example, the strength of the magnetic field component MFx is expressed in positive values if the direction of the magnetic field component MFx is the X direction, and in negative values if the direction of the magnetic field component MFx is the −X direction. The strength of the magnetic field component MFx changes periodically as the magnetic sensor 2 or the magnetic field generator 3 moves along the direction parallel to the X direction. The direction parallel to the X direction corresponds to a first direction according to the present invention.

The magnetic sensor 2 also detects a noise magnetic field Mex other than the target magnetic field. The noise magnetic field Mex can include a component parallel to the X direction, a component parallel to the Y direction, and a component parallel to the Z direction. In particular, in the present embodiment, the magnetic sensor 2 detects the strength of the component of the noise magnetic field Mex in a direction parallel to the X direction. The noise magnetic field Mex may be a magnetic field that is uniform within the moving range of the magnetic sensor 2 or the magnetic field generator 3, or a magnetic field at least either one of whose direction and strength varies depending on the position in the moving range.

Figure 3:
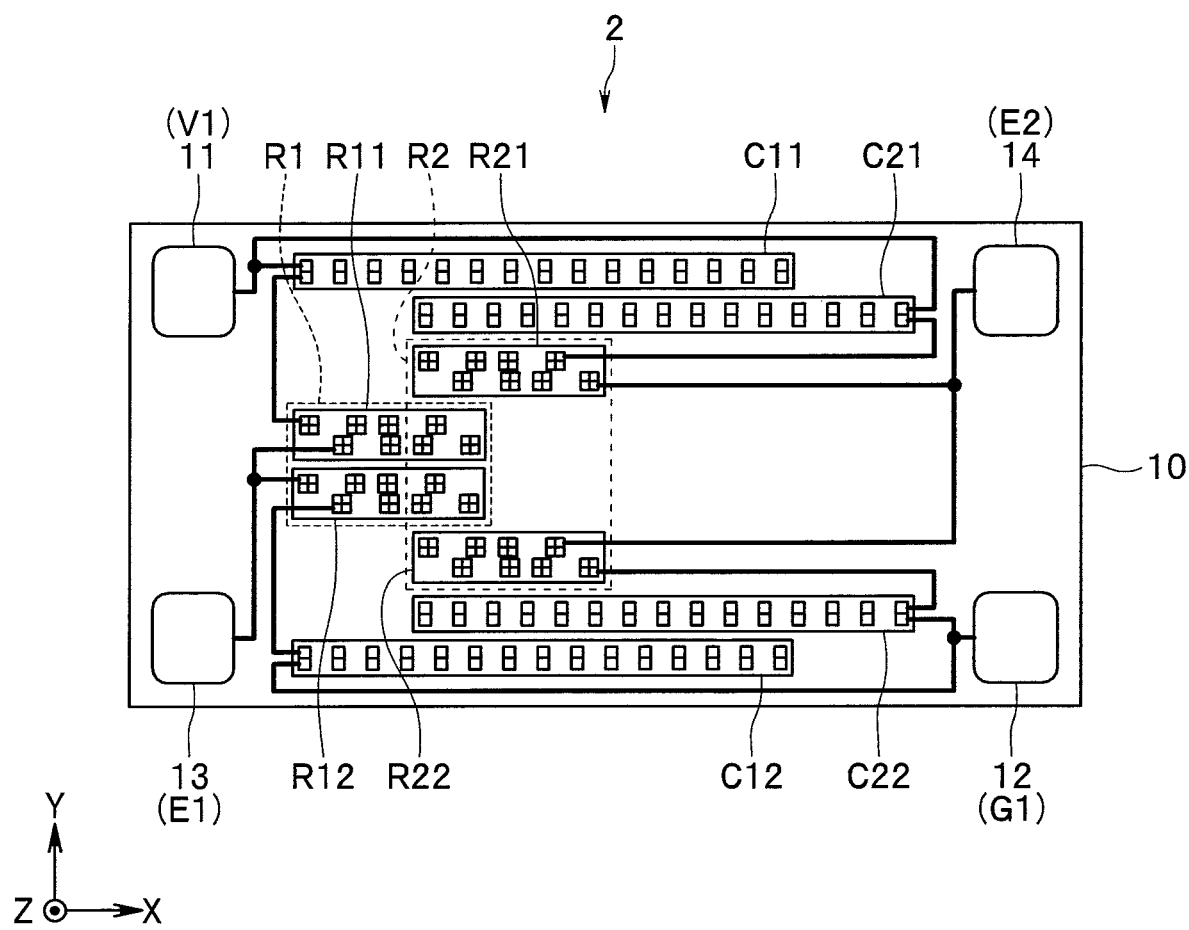
FIG. 3 is a plan view showing a magnetic sensor according to the first embodiment of the invention.
Figure 4:
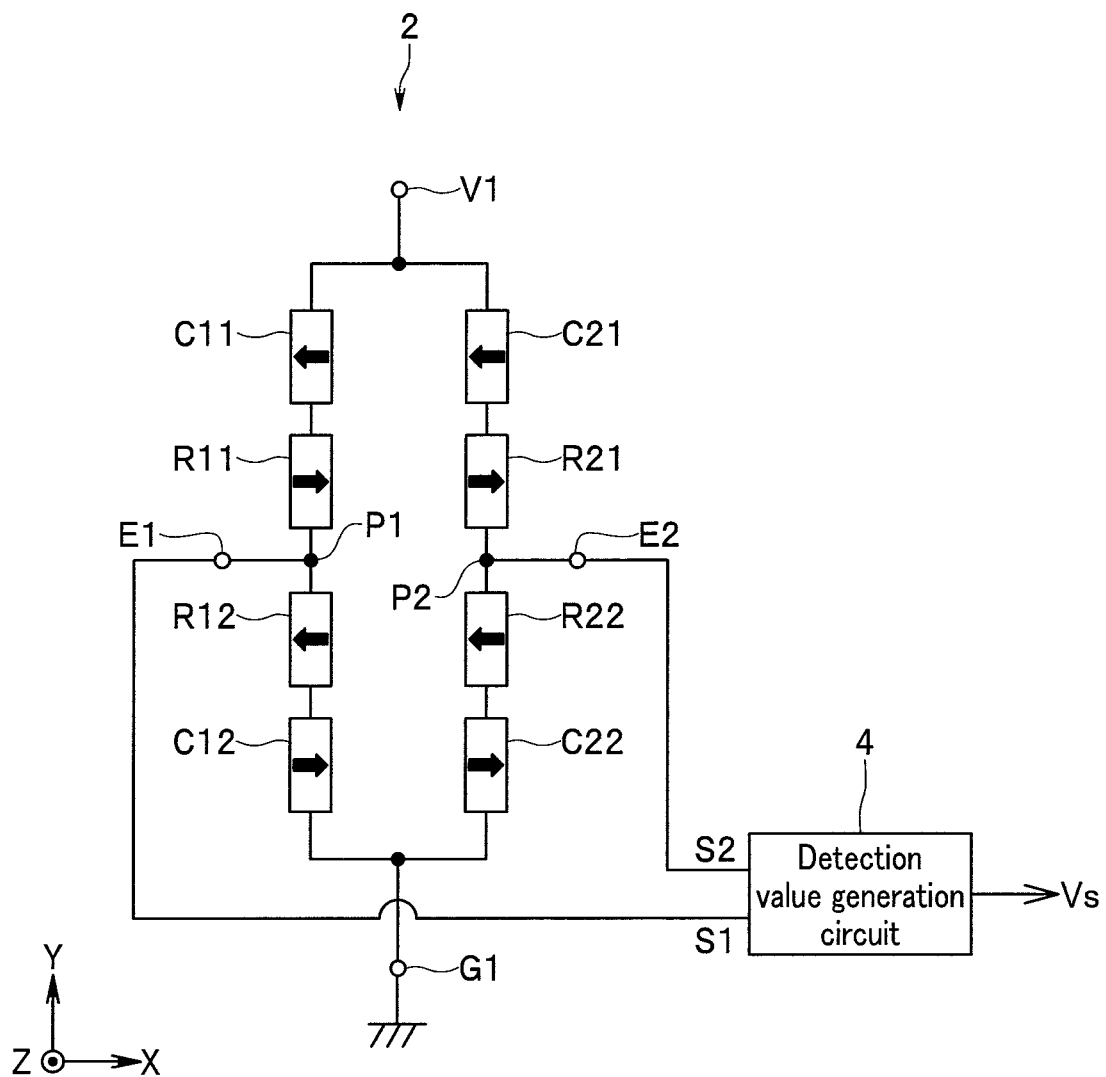
FIG. 4 is a circuit diagram showing a configuration of the magnetic sensor according to the first embodiment of the invention.

Next, the magnetic sensor 2 will be described in detail with reference to FIGS. 3 and 4. FIG. 3 is a plan view showing the magnetic sensor 2. FIG. 4 is a circuit diagram showing the configuration of the magnetic sensor 2. As shown in FIG. 4, the magnetic encoder 1 further includes a detection value generation circuit 4. The detection value generation circuit 4 generates a detection value Vs having a correspondence with the position of the magnetic field generator 3 relative to the magnetic sensor 2 on the basis of the at least one detection signal corresponding to the strength of the magnetic field component MFx, generated by the magnetic sensor 2. The detection value generation circuit 4 can be implemented by an application specific integrated circuit (ASIC) or a microcomputer, for example.

The magnetic sensor 2 includes a first resistor R11, a second resistor R12, a third resistor R21, and a fourth resistor R22 each configured to change periodically in resistance as the strength of the magnetic field component MFx changes periodically. The first to fourth resistors R11, R12, R21, and R22 each include a plurality of magnetoresistive elements (hereinafter referred to as MR elements) 50.

The magnetic sensor 2 further includes a first correction resistor C11, a second correction resistor C12, a third correction resistor C21, and a fourth correction resistor C22. The first to fourth correction resistors C11, C12, C21, and C22 each include a plurality of MR elements 50. The number of MR elements 50 in each of the first to fourth resistors R11, R12, R21, and R22 is desirably greater than or equal to the number of the plurality of MR elements 50 in each of the first to fourth correction resistors C11, C12, C21, and C22.

The magnetic sensor 2 further includes a power supply port V1, a ground port G1, a first output port E1, and a second output port E2. A voltage of predetermined magnitude is applied to the power supply port V1. The ground port G1 is connected to the ground. The first and second output ports E1 and E2 are connected to the detection value generation circuit 4. The magnetic sensor 2 is preferably driven by a constant voltage.

The power supply port V1 corresponds to a first port of the present invention. The ground port G1 corresponds to a second port of the present invention. The first and second output ports E1 and E2 correspond to a third port of the present invention.

The magnetic sensor 2 generates a signal having a correspondence with the potential at the first output E1 as a first detection signal S1, and generates a signal having a correspondence with the potential at the second output port E2 as a second detection signal S2. The detection value generation circuit 4 generates the detection value Vs on the basis of the first and second detection signals S1 and S2. At least either the magnetic sensor 2 or the detection value generation circuit 4 may be configured to be able to correct the amplitude, phase, and offset of each of the first and second detection signals S1 and S2.

As shown in FIG. 4, the first resistor R11 and the first correction resistor C11 are connected in series between the power supply port V1 and the first output port E1. The second resistor R12 and the second correction resistor C12 are connected in series between the ground port G1 and the first output port E1. The first output port E1 is located between the first resistor R11 and first correction resistor C11 and the ground port G1.

As shown in FIG. 4, the third resistor R21 and the third correction resistor C21 are connected in series between the power supply port V1 and the second output port E2. The fourth resistor R22 and the fourth correction resistor C22 are connected in series between the ground port G1 and the second output port E2. The second output port E2 is located between the third resistor R21 and third correction resistor C21 and the ground port G1.

As shown in FIG. 4, the first resistor R11 and the second resistor R12 are connected in series via a first connection point P1 connected to the first output port E1. The third resistor R21 and the fourth resistor R22 are connected in series via a second connection point P2 connected to the second output port E2.

An end of the first resistor R11 opposite to the first connection point P1 is connected to the first correction resistor C11. The first correction resistor C11 is connected to the power supply port V1. The foregoing end of the first resistor R11 is an end in the circuit diagram.

An end (end on the circuit diagram) of the second resistor R12 opposite to the first connection point P1 is connected to the second correction resistor C12. The second correction resistor C12 is connected to the ground port G1.

An end (end on the circuit diagram) of the third resistor R21 opposite to the second connection point P2 is connected to the third correction resistor C21. The third correction resistor C21 is connected to the power supply port V1.

An end (end on the circuit diagram) of the fourth resistor R22 opposite to the second connection point P2 is connected to the fourth correction resistor C22. The fourth correction resistor C21 is connected to the ground port G1.

The resistance of the first resistor R11 will be referred to as a first resistance. The resistance of the first correction resistor C11 will be referred to as a second resistance. The first resistance changes with the noise magnetic field Mex in addition to the magnetic field component MFx. The first correction resistor C11 is configured so that a change in the sum of the first resistance and the second resistance due to the noise magnetic field Mex is smaller than a change in the first resistance due to the noise magnetic field Mex.

Each of the resistances of the second to fourth resistors R12, R21, and R22 also changes with the noise magnetic field Mex in addition to the magnetic field component MFx. The second correction resistor C12 is configured so that a change in the sum of the resistances of the second resistor R12 and the second correction resistor C12 due to the noise magnetic field Mex is smaller than a change in the resistance of the second resistor R12 due to the noise magnetic field Mex. The third correction resistor C21 is configured so that a change in the sum of the resistances of the third resistor R21 and the third correction resistor C21 due to the noise magnetic field Mex is smaller than a change in the resistance of the third resistor R21 due to the noise magnetic field Mex. The fourth correction resistor C22 is configured so that a change in the sum of the resistances of the fourth resistor R22 and the fourth correction resistor C22 due to the noise magnetic field Mex is smaller than a change in the resistance of the fourth resistor R22 due to the noise magnetic field Mex.

The second resistor R12 is configured so that the change in the resistance of the second resistor R12 has a phase different from that of the change in the resistance of the first resistor R11. Similarly, the fourth resistor R22 is configured so that the change in the resistance of the fourth resistor R22 has a phase different from that of the change in the resistance of the third resistor R21. In the present embodiment, the phase differences between the resistances are equal to or substantially equal to ½ of the period of the changes in the resistances.

As shown in FIG. 3, the magnetic sensor 2 further includes a substrate 10, and a power supply terminal 11, a ground terminal 12, a first output terminal 13 and a second output terminal 14 that are located on the substrate 10. The power supply terminal 11 constitutes the power supply port V1. The ground terminal 12 constitutes the ground port G1. The first and second output terminals 13 and 14 constitute the first and second output ports E1 and E2, respectively.

As shown in FIG. 3, the first and second resistors R11 and R12 are located in a first region R1 on the substrate 10. The third and fourth resistors R21 and R22 are located in a second region R2 on the substrate 10. At least a part of the second region R2 is located at a position different from the first region R1 in the direction parallel to the X direction. In the example shown in FIG. 3, a part of the second region R2 overlaps a part of the first region R1.

The second region R2 may be located anterior to the first region R1 in the X direction, or anterior to the first region R1 in the −X direction. FIG. 3 shows an example where the second region R2 is located anterior to the first region R1 in the X direction. The first and second regions R1 and R2 may be located at the same position or at different positions in the Z direction.

As shown in FIG. 3, the first and second resistors R11 and R12 are located between the third and fourth resistors R21 and R22 in a direction parallel to the Y direction. The first correction resistor C11 is located anterior to the third resistor R21 in the Y direction. The third correction resistor C21 is located between the third resistor R21 and the first correction resistor C11.

The second correction resistor C12 is located anterior to the fourth resistor R22 in the −Y direction. The fourth correction resistor C22 is located between the fourth resistor R22 and the second correction resistor C12.

Next, a configuration of the first to fourth resistors R11, R12, R21, and R22 will be described. Each of the first and second detection signals S1 and S2 contains an ideal component which varies periodically with a predetermined signal period in such a manner as to trace an ideal sinusoidal curve (including sine and cosine waveforms). In the present embodiment, the first to fourth resistors R11, R12, R21, and R22 are configured so that the ideal component of the first detection signal S1 and the ideal component of the second detection signal S2 have respective different phases. The size Lp of one pitch shown in FIG. 2 corresponds to one period of the ideal components, i.e., an electrical angle of 360°.

Each of the first and second detection signals S1 and S2 contains error components corresponding to harmonics of the ideal component aside from the ideal component. In the present embodiment, the first to fourth resistors R11, R12, R21, and R22 are configured to reduce the error components.

The configuration of the first to fourth resistors R11, R12, R21, and R22 will be described in detail below. Initially, the configuration of the MR elements 50 will be described. In the present embodiment, the MR elements 50 are each a spin-valve MR element. The spin-valve magnetoresistive element includes a magnetization pinned layer having a magnetization whose direction is fixed, a free layer having a magnetization whose direction is variable depending on the direction of the magnetic field component MFx, and a gap layer located between the magnetization pinned layer and the free layer. The spin-valve MR element may be a tunneling magnetoresistive (TMR) element or a giant magnetoresistive (GMR) element. In particular, in the present embodiment, the MR element 50 is desirably a TMR element to reduce the dimensions of the magnetic sensor 2. In the TMR element, the gap layer is a tunnel barrier layer. In the GMR element, the gap layer is a nonmagnetic conductive layer. The resistance of the spin-valve MR element changes with the angle that the magnetization direction of the free layer forms with respect to the magnetization direction of the magnetization pinned layer. The resistance of the spin-valve MR element is at its minimum value when the foregoing angle is 0°, and at its maximum value when the foregoing angle is 180°.

In FIG. 4, the arrows shown inside the first to fourth resistors R11, R12, R21, and R22 indicate the magnetization directions of the magnetization pinned layers in the respective plurality of MR elements 50 included in the resistors. The magnetization directions of the magnetization pinned layers in the respective plurality of MR elements 50 included in the first and third resistors R11 and R21 are the X direction. The magnetization directions of the magnetization pinned layers in the respective plurality of MR elements 50 included in the second and fourth resistors R12 and R22 are the −X direction. In such a case, the magnetization directions of the free layers in the respective plurality of MR elements 50 change within the XY plane with the strength of the magnetic field component MFx. Consequently, the potential at each of the first and second output ports E1 and E2 changes with the strength of the magnetic field component MFx.

Next, the layout of the plurality of MR elements 50 in each of the first to fourth resistors R11, R12, R21, and R22 will be described. As employed herein, a set of one or more MR elements 50 will be referred to as an element group. The first to fourth resistors R11, R12, R21, and R22 each include a plurality of element groups. To reduce the error components, the plurality of element groups are located at predetermined distances from each other on the basis of the size Lp of one pitch. In the following description, the layout of the plurality of element groups will be described with reference to predetermined positions of the element groups. An example of the predetermined position of an element group is the center of gravity of the element group when viewed in the Z direction.

Figure 5:
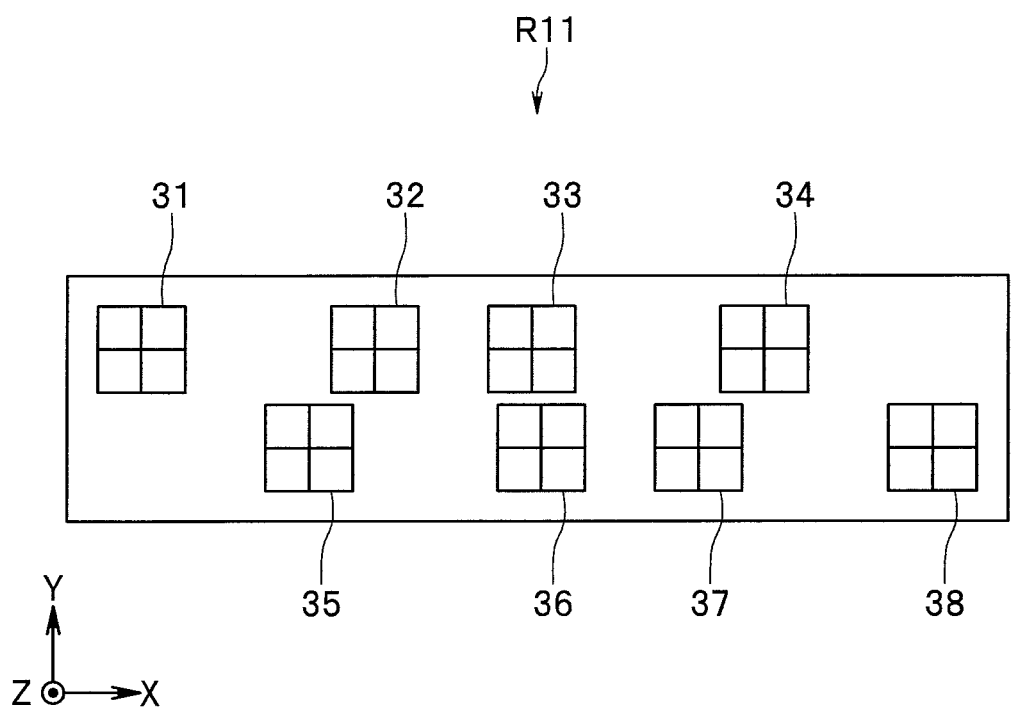
FIG. 5 is a plan view showing a first resistor of the first embodiment of the invention.

FIG. 5 is a plan view showing the first resistor R11. As shown in FIG. 5, the first resistor R11 includes eight element groups 31, 32, 33, 34, 35, 36, 37, and 38. Each of the element groups 31 to 38 is divided into four sections. Each section includes one or more MR elements 50. In other words, each element group includes four or more MR elements 50. The plurality of MR elements 50 may be connected in series within each element group. In such a case, the plurality of element groups may be connected in series. Alternatively, the plurality of MR elements 50 may be connected in series regardless of the element groups.

In FIG. 5, the element groups 31 to 38 are located to reduce an error component corresponding to the third harmonic (third-order harmonic) of the ideal component, an error component corresponding to the fifth harmonic (fifth-order harmonic) of the ideal component, and an error component corresponding to the seventh harmonic (seventh-order harmonic) of the ideal component. As shown in FIG. 5, the element groups 31 to 34 are arranged along the X direction. The element group 32 is located at a position Lp/10 away from the element group 31 in the X direction. The element group 33 is located at a position Lp/6 away from the element group 31 in the X direction. The element group 34 is located at a position Lp/10+Lp/6 away from the element group 31 in the X direction (at a position Lp/6 away from the element group 32 in the X direction).

As shown in FIG. 5, the element groups 35 to 38 are arranged along the X direction, anterior to the element groups 31 to 34 in the −Y direction. The element group 35 is located at a position Lp/14 away from the element group 31 in the X direction. The element group 36 is located at a position Lp/14+Lp/10 away from the element group 31 in the X direction (at a position Lp/14 away from the element group 32 in the X direction). The element group 37 is located at a position Lp/14+Lp/6 away from the element group 31 in the X direction (at a position Lp/14 away from the element group 33 in the X direction). The element group 38 is located at a position Lp/14+Lp/10+Lp/6 away from the element group 31 in the X direction (at a position Lp/14 away from the element group 34 in the X direction).

The layout of a plurality of element groups for reducing a plurality of error components is not limited to the example shown in FIG. 5. Suppose now that n and m are integers that are greater than or equal to 1 and different from each other. For example, to reduce an error component corresponding to a (2n+1)th-order harmonic, a first element group is located at a position Lp/(4n+2) away from a second element group in the X direction. To further reduce an error component corresponding to a (2m+1)th-order harmonic, a third element group is located at a position Lp/(4m+2) away from the first element group in the X direction, and a fourth element group is located at a position Lp/(4m+2) away from the second element group in the X direction. In such a manner, to reduce error components corresponding to a plurality of harmonics, each of a plurality of element groups for reducing an error component corresponding to one harmonic is located at a position a predetermined distance based on the size Lp of one pitch away from a corresponding one of a plurality of element groups for reducing an error component corresponding to another harmonic in the X direction.

In the present embodiment, the configuration and layout of the plurality of element groups in each of the second to fourth resistors R12, R21, and R22 are the same as those of the plurality of element groups in the first resistor R11. More specifically, the second to fourth resistors R12, R21, and R22 each include eight element groups 31 to 38 having the configuration and positional relationship shown in FIG. 5. The element group 31 of the second resistor R12 is located at the same position as the element group 31 of the first resistor R11 is in the X direction. The element group 31 of the third resistor R21 is located at a position Lp/4 away from the element group 31 of the first resistor R11 in the X direction. The element group 31 of the fourth resistor R22 is located at a position Lp/4 away from the element group 31 of the second resistor R12 in the X direction.

The configuration of the first to fourth resistors R11, R12, R21, and R22 described above makes a phase difference of the ideal component of the second detection signal S2 from the ideal component of the first detection signal S1 an odd number of times ¼ of a predetermined signal period (the signal period of the ideal component), and reduces the error components of the respective first and second detection signals S1 and S2.

In the light of the production accuracy of the MR elements 50 and other factors, the magnetization directions of the magnetization pinned layers, the positions of the first to fourth resistors R11, R12, R21, and R22, and the element groups 31 to 38 may be slightly different from the above-described directions and positions.

Next, a configuration of the first to fourth correction resistors C11, C12, C21, and C22 will be described. As described above, the first to fourth correction resistors C11, C12, C21, and C22 each include a plurality of MR elements 50. In FIG. 4, the arrows shown inside the first to fourth correction resistors C11, C12, C21, and C22 indicate the magnetization directions of the magnetization pinned layers in the respective plurality of MR elements 50 included in the resistors.

The magnetization direction of the magnetization pinned layer in each of the plurality of MR elements 50 of the first correction resistor C11 is a second magnetization direction opposite to a first magnetization direction that is the magnetization direction of the magnetization pinned layer in each of the plurality of MR elements 50 of the first resistor R11. In the present embodiment, the first magnetization direction is the X direction, and the second magnetization direction is the −X direction.

The magnetization direction of the magnetization pinned layer in each of the plurality of MR elements 50 of the second correction resistor C12 is a fourth magnetization direction opposite to a third magnetization direction that is the magnetization direction of the magnetization pinned layer in each of the plurality of MR elements 50 of the second resistor R12. In the present embodiment, the third magnetization direction is the −X direction, and the fourth magnetization direction is the X direction.

The magnetization direction of the magnetization pinned layer in each of the plurality of MR elements 50 of the third correction resistor C21 is a sixth magnetization direction opposite to a fifth magnetization direction that is the magnetization direction of the magnetization pinned layer in each of the plurality of MR elements 50 of the third resistor R21. In the present embodiment, the fifth magnetization direction is the X direction, and the sixth magnetization direction is the −X direction.

The magnetization direction of the magnetization pinned layer in each of the plurality of MR elements 50 of the fourth correction resistor C22 is an eighth magnetization direction opposite to a seventh magnetization direction that is the magnetization direction of the magnetization pinned layer in each of the plurality of MR elements 50 of the fourth resistor R22. In the present embodiment, the seventh magnetization direction is the −X direction, and the eighth magnetization direction is the X direction.

The plurality of MR elements 50 in each of the first to fourth correction resistors C11, C12, C21, and C22 are arranged in rows along the X direction at predetermined intervals. In particular, in the present embodiment, the first to fourth correction resistors C11, C12, C21, and C22 each include a plurality of element groups connected in series. The plurality of element groups are arranged in a row along the X direction.

Figure 6:
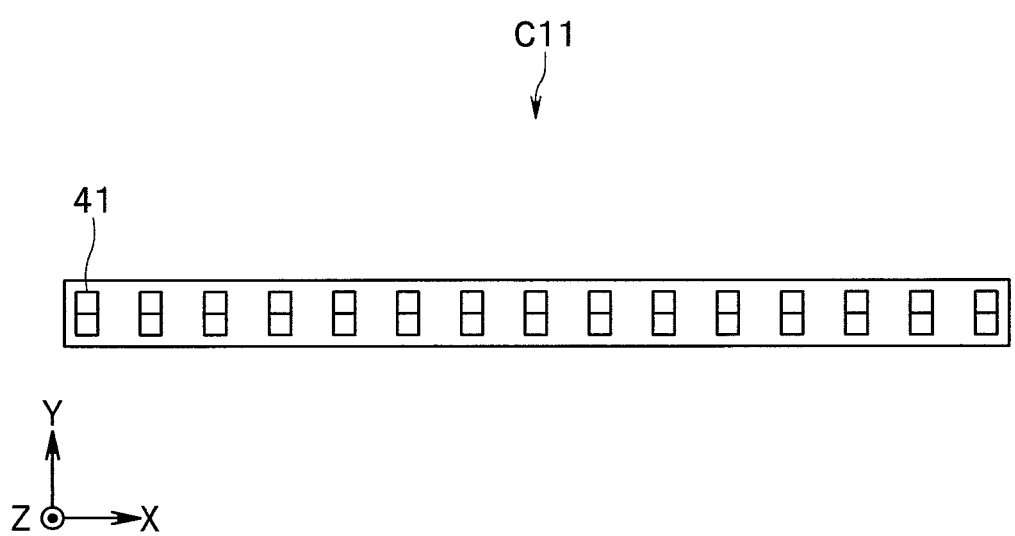
FIG. 6 is a plan view showing a first correction resistor of the first embodiment of the invention.

FIG. 6 is a plan view showing the first correction resistor C11. As shown in FIG. 6, the first correction resistor C11 includes a plurality of element groups 41 arranged at predetermined intervals. The plurality of element groups 41 are each divided into two sections. Each section includes one or more MR elements 50. In other words, each element group includes two or more MR elements 50.

The distance from the MR element 50 located at the end in the X direction to the MR element 50 located at the end in the −X direction among the plurality of elements 50 of the first correction resistor C11 will be referred to as a first distance. The first distance is equal to the distance from the element group 41 located at the end in the X direction to the element group 41 located at the end in the −X direction among the plurality of element groups 41 of the first correction resistor C11. The plurality of MR elements 50 are located so that the first distance coincides with a distance equivalent to X periods of the change in the strength of the magnetic field component MFx. X is preferably a value of 1 or more and 10 or less, more preferably a value of 1 or more and 5 or less.

The configuration of the first correction resistor C11 described above averages changes in the resistances of the respective plurality of MR elements 50 within the range of X periods (X is the foregoing preferable value) of the change in the strength of the magnetic field component MFx. This makes a change in the resistance of the first correction resistor C11 due to the magnetic field component MFx smaller than that in the resistance of the first resistor R11 due to the magnetic field component MFx.

In particular, in the present embodiment, the plurality of MR elements 50 are arranged so that the first distance coincides with a distance equivalent to one period of the change in the strength of the magnetic field component MFx. In such a case, the change in the resistance of the first correction resistor C11 due to the magnetic field component MFx is zero or substantially zero. As a result, the resistance of the first correction resistor C11 changes due only to the noise magnetic field Mex regardless of the position of the magnetic field generator 3 relative to the magnetic sensor 2. In the present embodiment, the size Lp of one pitch shown in FIG. 2 corresponds to the distance equivalent to one period of the change in the strength of the magnetic field component MFx.

In the present embodiment, the plurality of element groups in each of the second to fourth correction resistors C12, C21, and C22 have the same configuration and layout as those of the plurality of element groups in the first correction resistor C11. Specifically, the second to fourth correction resistors C12, C21, and C22 each include a plurality of element groups 41 having the configuration and positional relationship shown in FIG. 6. The resistance of each of the second to fourth correction resistors C12, C21, and C22 changes with the magnetic field component MFx and the noise magnetic field Mex in the same manner as the resistance of the first correction resistor C11 does.

A change in the resistance of the second correction resistor C12 due to the magnetic field component MFx is smaller than that in the resistance of the second resistor R12 due to the magnetic field component MFx. A change in the resistance of the third correction resistor C21 due to the magnetic field component MFx is smaller than that in the resistance of the third resistor R21 due to the magnetic field component MFx. A change in the resistance of the fourth correction resistor C22 due to the magnetic field component MFx is smaller than that in the resistance of the fourth resistor R22 due to the magnetic field component MFx.

In each of the first to fourth correction resistors C11, C12, C21, and C22, the element group 41 located at the end in the −X direction will be referred to as a reference element group 41. The reference element group 41 of the first correction resistor C11 is located at the same or substantially the same position as the element group 31 of the first resistor R11 is in the X direction. The reference element group 41 of the second correction resistor C12 is located at the same or substantially the same position as the element group 31 of the second resistor R12 is in the X direction. The reference element group 41 of the third correction resistor C21 is located at the same or substantially the same position as the element group 31 of the third resistor R21 is in the X direction. The reference element group 41 of the fourth correction resistor C22 is located at the same or substantially the same position as the element group 31 of the fourth resistor R22 is in the X direction.

The reference element group 41 of the second correction resistor C12 is located at the same position as the reference element group 41 of the first correction resistor C11 is in the X direction. The reference element group 41 of the third correction resistor C21 is located at a position Lp/4 away from the reference element group 41 of the first correction resistor C11 in the X direction. The reference element group 41 of the fourth correction resistor C22 is located at a position Lp/4 away from the reference element group 41 of the second correction resistor C12 in the X direction.

In the light of the production accuracy of the MR elements 50 and other factors, the magnetization directions of the magnetization pinned layers, the positions of the first to fourth correction resistors C11, C12, C21, and C22, and the element group 41 may be slightly different from the above-described directions and positions. If the first distance is the same as the size Lp of one pitch, the changes in the resistances of the respective first to fourth correction resistors C11, C12, C21, and C22 due to the magnetic field component MFx may vary slightly in view of the manufacturing accuracy of the MR elements 50.

Figure 7:
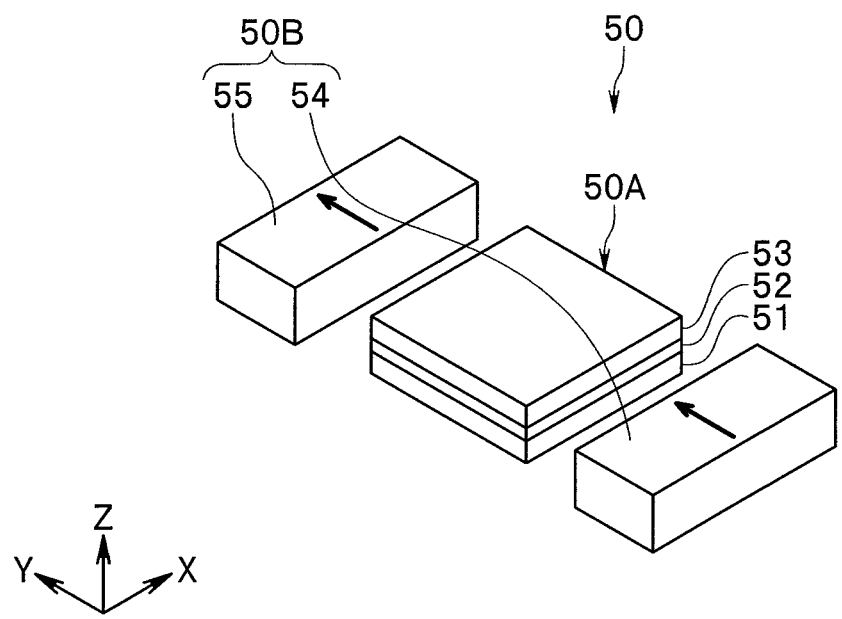
FIG. 7 is a perspective view showing a first example of a magnetoresistive element of the first embodiment of the invention.

Next, first and second examples of an MR element 50 will be described with reference to FIGS. 7 and 8. FIG. 7 is a perspective view showing the first example of the MR element 50. In the first example, the MR element 50 includes a layered film 50A including a magnetization pinned layer 51, a gap layer 52, and a free layer 53 stacked in this order in the Z direction. The layered film 50A has a square or almost square planar shape when viewed in the Z direction.

The bottom surface of the layered film 50A of the MR element 50 is electrically connected to the bottom surface of the layered film 50A of another MR element 50 by a not-shown lower electrode. The top surface of the layered film 50A of the MR element 50 is electrically connected to the top surface of the layered film 50A of yet another MR element 50 by a not-shown upper electrode. In such a manner, the plurality of MR elements 50 are connected in series. It should be appreciated that the layers 51 to 53 of each layered film 50A may be stacked in the reverse order to that shown in FIG. 7.

The MR element 50 further includes a bias magnetic field generator 50B that generates a bias magnetic field to be applied to the free layer 53. The direction of the bias magnetic field intersects the direction parallel to the X direction. In the first example, the bias magnetic field generator 50B includes two magnets 54 and 55. The magnet 54 is located in front of the layered film 50A in the −Y direction. The magnet 55 is located in front of the layered film 50A in the Y direction. In particular, in the first example, the layered film 50A and the magnets 54 and 55 are located at positions to intersect an imaginary plane parallel to the XY plane. In FIG. 7, the arrows in the magnets 54 and 55 indicate the magnetization directions of the magnets 54 and 55. In the first example, the direction of the bias magnetic field is the Y direction.

Figure 8:
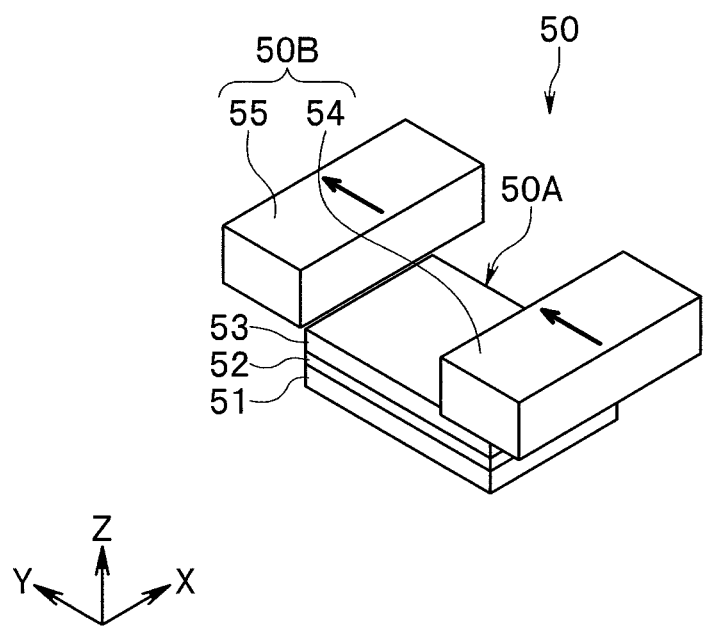
FIG. 8 is a perspective view showing a second example of the magnetoresistive element of the first embodiment of the invention.

FIG. 8 is a perspective view showing the second example of the MR element 50. The second example of the MR element 50 has the same configuration as that of the first example of the MR element 50 except the planar shape of the layered film 50A and the positions of the magnets 54 and 55. In the second example, the magnets 54 and 55 are located at positions different from that of the layered film 50A in the Z direction. In particular, in the example shown in FIG. 8, the magnets 54 and 55 are located in front of the layered film 50A in the Z direction. When viewed in the Z direction, the layered film 50A has a rectangular planar shape long in the Y direction. When viewed in the Z direction, the magnets 54 and 55 are located to overlap the layered film 50A.

The direction of the bias magnetic field and the layout of the magnets 54 and 55 are not limited to the examples shown in FIGS. 7 and 8. For example, the direction of the bias magnetic field may be a direction oblique to the Y direction. The magnets 54 and 55 may be located at respective different positions in the direction parallel to the X direction. Other examples of the MR element 50 will be described below as modification examples.

Next, a method for generating the detection value Vs of the present embodiment will be described. For example, the detection value generation circuit 4 generates the detection value Vs in the following manner. If the magnitude of the voltage applied to the power supply port V1 is Vdd, the detection value generation circuit 4 determines an initial detection value in the range of 0° or more and less than 360° by calculating atan[(S2−Vdd/2)/(S1−Vdd/2)], for example. Note that "atan" represents arctangent. The initial detection value may be the value of the arctangent itself, or may be a value obtained by adding a predetermined angle to the value of the arctangent.

If the value of the foregoing arctangent is 0°, for example, the position of an N pole of the magnetic field generator 3 and the position of the element group 31 in each of the first and second resistors R11 and R12 coincide in the X direction. If the foregoing value of the arctangent is 180°, the position of an S pole of the magnetic field generator 3 and the position of the element group 31 in each of the first and second resistors R11 and R12 coincide in the X direction. The initial detection value thus has a correspondence with the position of the magnetic field generator 3 relative to the magnetic sensor 2 (hereinafter, also referred to as relative position) within one pitch.

The detection value generation circuit 4 also counts the number of rotations of the electrical angle from a reference position, with one period of the initial detection value as an electrical angle of 360°. One rotation of the electrical angle corresponds to the amount of movement of the relative position as much as one pitch. The detection value generation circuit 4 generates the detection value Vs having a correspondence with the relative position on the basis of the initial detection value and the number of rotations of the electrical angle.

Next, the operation and effects of the magnetic encoder 1 and the magnetic sensor 2 according to the present embodiment will be described. In the present embodiment, the first resistor R11 and the first correction resistor C11 are connected in series. Since the plurality of MR elements 50 of the first resistor R11 are configured as described above, the resistance of the first resistor R11 changes periodically as the strength of the magnetic field component MFx changes periodically. Since the plurality of MR elements 50 of the first correction resistor C11 are configured as described above, a change in the resistance of the first correction resistor C11 due to the magnetic field component MFx is zero and the resistance of the first correction resistor C11 changes due only to the noise magnetic field Mex. According to the present embodiment, the influence of the noise magnetic field Mex can thus be reduced.

Figure 9A:
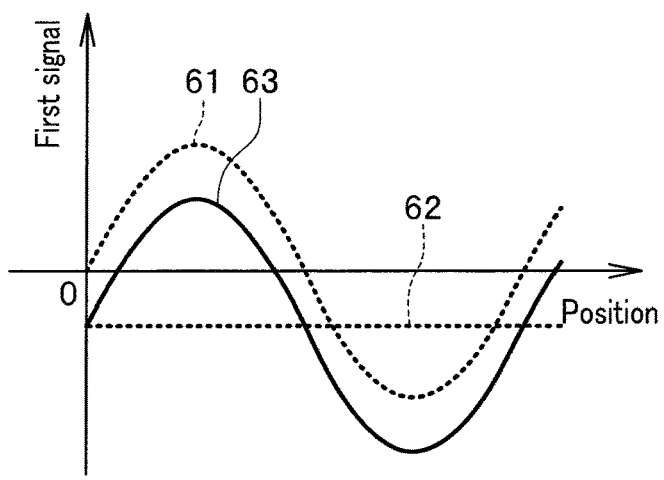
FIG. 9A is an explanatory diagram schematically showing a first signal according to the first embodiment of the invention.
Figure 9B:
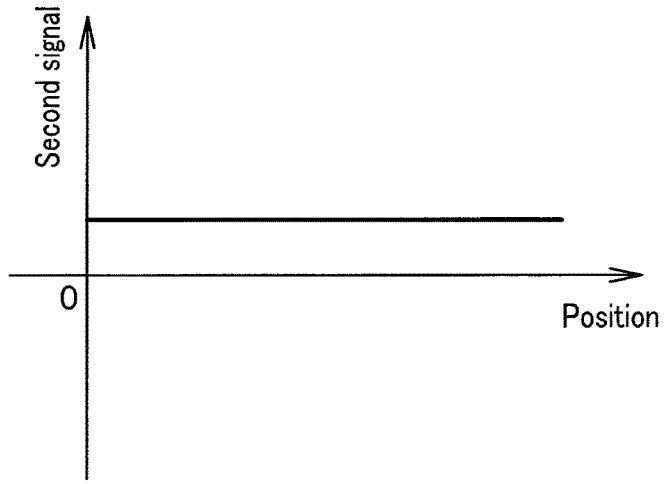
FIG. 9B is an explanatory diagram schematically showing a second signal according to the first embodiment of the invention.
Figure 9C:
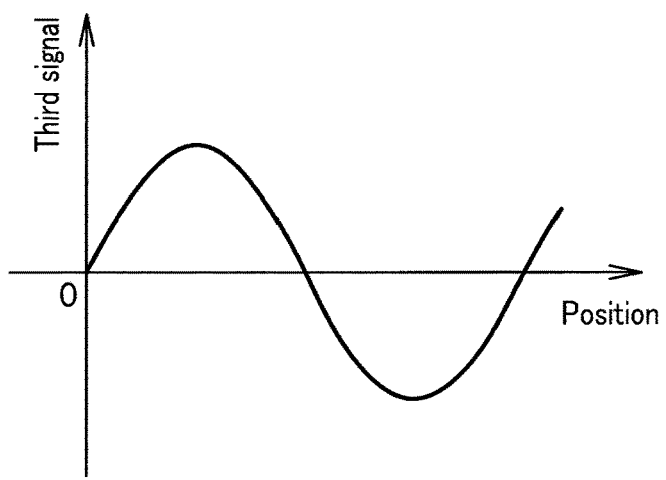
FIG. 9C is an explanatory diagram schematically showing a third signal according to the first embodiment of the invention.

A signal corresponding to the potential across the first resistor R11 will be referred to as a first signal. A signal corresponding to the potential across the first correction resistor C11 will be referred to as a second signal. A signal corresponding to the potential across the series circuit including the first resistor R11 and the first correction resistor C11 will be referred to as a third signal. FIGS. 9A to 9C are explanatory diagrams schematically showing the first to third signals. FIGS. 9A to 9C show changes in the first to third signals with respect to the position of the magnetic field generator 3 relative to the magnetic sensor 2 (in FIGS. 9A to 9C, referred to simply as a position). FIG. 9A shows a change in the first signal. FIG. 9B shows a change in the second signal. FIG. 9C shows a change in the third signal. In FIGS. 9A to 9C, the values of the respective first to third signals are expressed in positive values if the direction of the magnetic field component MFx is the X direction. The values of the respective first to third signals are expressed in negative values if the direction of the magnetic field component MFx is the −X direction.

The first signal contains a main component that varies periodically as the strength of the magnetic field component MFx changes periodically, and an error component that varies with the noise magnetic field Mex. In FIG. 9A, the main component is denoted by the reference numeral 61, the error component by the reference numeral 62, and the first signal by the reference numeral 63. FIGS. 9A to 9C show a case where the direction and strength of the noise magnetic field Mex are constant regardless of position or time. As shown in FIG. 9A, the first signal 63 has an offset due to the error component 62, i.e., the noise magnetic field Mex.

As shown in FIG. 9A, the error component 62 is constant regardless of position. As shown in FIG. 9B, the second signal is also constant regardless of position. Note that the sign of the value of the second signal is opposite to that of the value of the error component 62. The reason is that, as described above, the magnetization direction (second magnetization direction) of the magnetization pinned layer in each of the plurality of MR elements 50 of the first correction resistor C11 is opposite to the magnetization direction (first magnetization direction) of the magnetization pinned layer in each of the plurality of MR elements 50 of the first resistor R11. As shown in FIG. 9C, the offset due to the noise magnetic field Mex is thus eliminated from the third signal. According to the present embodiment, the influence of the noise magnetic field Mex on the first resistor R11 can thus be reduced.

The foregoing description of the pair including the first resistor R11 and the first correction resistor C11 also applies to the pair including the second resistor R12 and the second correction resistor C12. According to the present embodiment, the influence of the noise magnetic field Mex on each of the first and second resistors R11 and R12 can be reduced, and the influence of the noise magnetic field Mex on the potential at the first output port E1 can be reduced.

Similarly, the foregoing description of the pair including the first resistor R11 and the first correction resistor C11 also applies to the pair including the third resistor R21 and the third correction resistor C21 and the pair including the fourth resistor R22 and the fourth correction resistor C22. According to the present embodiment, the influence of the noise magnetic field Mex on each of the third and fourth resistors R21 and R22 can be reduced, and the influence of the noise magnetic field Mex on the potential at the second output port E2 can be reduced. According to the present embodiment, the influence of the noise magnetic field Mex on each of the first and second output ports E1 and E2 can be reduced. The influence of the noise magnetic field Mex on each of the first and second detection signals S1 and S2 can thus be reduced, and as a result, the influence of the noise magnetic field Mex on the detection value Vs can be reduced.

In the present embodiment, the first to fourth resistors R11, R12, R21, and R22 and the first to fourth correction resistors C11, C12, C21, and C22 can be configured by arranging a plurality of MR elements 50 as described above. That is, the magnetic sensor 2 has a simple configuration. According to the present embodiment, the influence of the noise magnetic field can thus be reduced with a simple configuration.

Now, the effects of the present embodiment in a case where the strength of the noise magnetic field Mex changes with position will be described with reference to a simulation result. A model of a practical example and a model of a comparative example used in the simulation will initially be described. The model of the practical example is a model for the magnetic encoder 1 according to the present embodiment. The model of the comparative example is a model for a magnetic encoder according to the comparative example, which includes a magnetic sensor according to the comparative example instead of the magnetic sensor 2 according to the present embodiment. The magnetic sensor according to the comparative example does not include the first to fourth correction resistors C11, C12, C21, and C22. In other respects, the configuration of the magnetic encoder according to the comparative example is the same as that of the magnetic encoder 1 according to the present embodiment.

In the simulation, the detection value Vs was determined while changing the position (hereinafter, referred to as a relative position) of the magnetic field generator 3 relative to the magnetic sensor 2, under the application of a noise magnetic field Mex whose strength changes with position. The detection value Vs was determined in association with the relative position. A difference between the detection value Vs and the relative position associated with the detection value Vs was then determined. The difference will hereinafter be referred to as an error. In the simulation, the first and second detection signals S1 and S2 each had an offset of zero in the absence of the noise magnetic field Mex.

Figure 10:
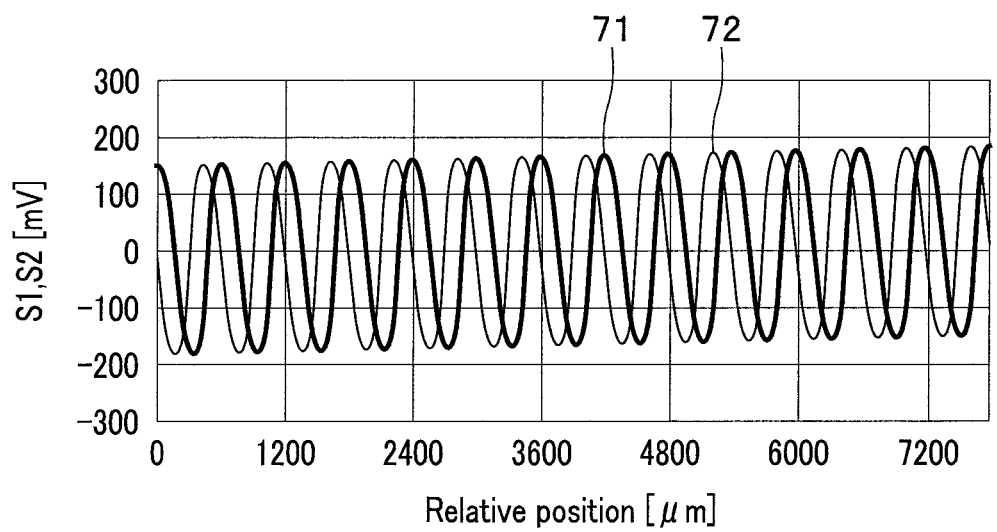
FIG. 10 is a waveform chart showing the waveforms of first and second detection signals in a model of a comparative example.

FIG. 10 is a waveform chart showing the waveforms of the first and second detection signals S1 and S2 in the model of the comparative example. In FIG. 10, the horizontal axis represents the relative position, and the vertical axis the values of the first and second detection signals S1 and S2. In FIG. 10, the first detection signal S1 is denoted by the reference numeral 71, and the second detection signal S2 by the reference numeral 72. As shown in FIG. 10, the offsets of the first and second detection signals S1 and S2 increase with the relative position.

Figure 11:
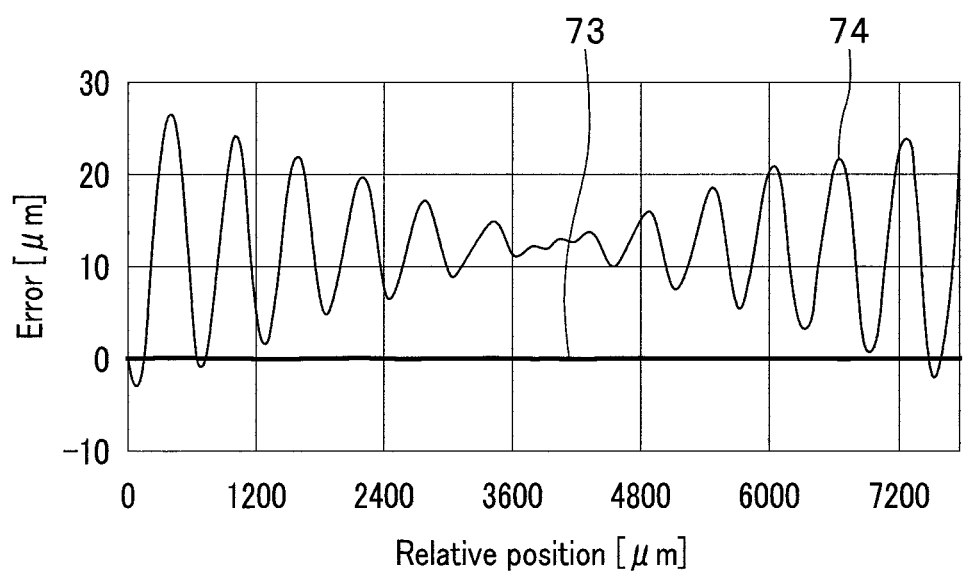
FIG. 11 is a characteristic chart showing errors occurring in a model of a practical example and the model of the comparative example.

FIG. 11 is a characteristic chart showing errors in the model of the practical example and the model of the comparative example. In FIG. 11, the horizontal axis represents the relative position, and the vertical axis the error. In FIG. 11, the error in the model of the practical example is denoted by the reference numeral 73, and the error in the model of the comparative example by the reference numeral 74. As shown in FIG. 11, the error 74 of the comparative example varies greatly, while the error 73 of the practical example is substantially zero. As can be seen from the simulation result, according to the present embodiment, the influence of the noise magnetic field Mex on the detection value Vs can be reduced.

Up to this point, an example where each of the first to fourth correction resistors C11, C12, C21, and C22 is configured so that the change in its resistance due to the magnetic field component MFx is zero and the resistance changes due only to the noise magnetic field Mex has been described. Here, the resistance of a resistor will be referred to as a first resistance, and the resistance of a correction resistor directly connected to the resistor will be referred to as a second resistance. The foregoing configuration is not restrictive, and effects similar to the foregoing can be obtained if the correction resistors are configured so that a change in the sum of the first and second resistances due to the noise magnetic field Mex is smaller than a change in the first resistance due to the noise magnetic field Mex. More specifically, suppose that the correction resistors are configured to reduce the change in the sum of the first and second resistances due to the noise magnetic field Mex. With such a configuration, as described with reference to FIGS. 9A to 9C, a deviation (offset) of the signal (third signal) corresponding to the potential across the series circuit including the resistor and the correction resistor due to the noise magnetic field Mex decreases, compared to that of the signal (first signal) corresponding to the potential across the resistor. The influence of the noise magnetic field Mex on the resistors can thus be reduced, and the influence of the noise magnetic field Mex on the potentials at the output ports can be reduced.

In the present embodiment, the first to fourth correction resistors C11, C12, C21, and C22 are each configured so that the change in the second resistance due to the magnetic field component MFx is smaller than the change in the first resistance due to the magnetic field component MFx. This can prevent the ratio of the first signal (see FIG. 9A) to the third signal (see FIG. 9C) from dropping. As a result, according to the present embodiment, the sensitivity of the magnetic sensor 2 to the magnetic field component MFx can be prevented from dropping.

In the present embodiment, the number of MR elements 50 in each of the first to fourth resistors R11, R12, R21, and R22 is greater than or equal to that of the plurality of MR elements 50 in each of the first to fourth correction resistors C11, C12, C21, and C22. According to the present embodiment, the sensitivity of the magnetic sensor 2 to the magnetic field component MFx can thus be prevented from dropping. Moreover, according to the present embodiment, an increase in the resistance of the half bridge circuit including the first and second resistors R11 and R12 and the first and second correction resistors C11 and C12 and an increase in the resistance of the half bridge circuit including the third and fourth resistors R21 and R22 and the third and fourth correction resistors C21 and C22 can be suppressed.

In the present embodiment, as described above, the first to fourth resistors R11, R12, R21, and R22 are configured to reduce the error components corresponding to harmonics of the ideal components. According to the present embodiment, the detection accuracy of the relative position can thus be improved.

By the way, in the present embodiment, the magnetic sensor 2 is desirably driven by a constant voltage. In the case of constant voltage driving, the potential at the first output port E1 (first detection signal S1) is known to be given by the resistances of the first and second resistors R11 and R12 and the magnitude of the voltage applied to the power supply port V1. Similarly, in the case of constant current driving, the potential at the first output port E1 (first detection signal S1) is known to be given by the resistances of the first to fourth resistors R11, R12, R21, and R22 and the value of the current for the constant current driving.

Suppose that a signal corresponding to a potential between both ends of a given MR element 50 contains an ideal component varying periodically to trace an ideal sinusoidal curve, error components corresponding to even-ordered harmonics of the ideal component, and error components corresponding to odd-ordered harmonics of the ideal component. Suppose also that the first to fourth resistors R11, R12, R21, and R22 are configured to reduce the error components corresponding to the odd-ordered harmonics of the first and second detection signals S1 and S2. In such a case, with the constant voltage driving, no error components corresponding to even-ordered harmonic components occur in the first detection signal S1. By contrast, with the constant current driving, error components corresponding to even-ordered harmonic components occur in the first detection signal S1. In the case of the constant current driving, the first to fourth resistors R11, R12, R21, and R22 therefore need to be configured to reduce the error components corresponding to the even-ordered harmonic components of the first detection signal S1, as well as to reduce the error components corresponding to the odd-ordered harmonic components of the first detection signal S1. From such a point of view, the magnetic sensor 2 is desirably driven by a constant voltage.

The foregoing description of the first detection signal S1 also applies to the second detection signal S2.

Figure 12:
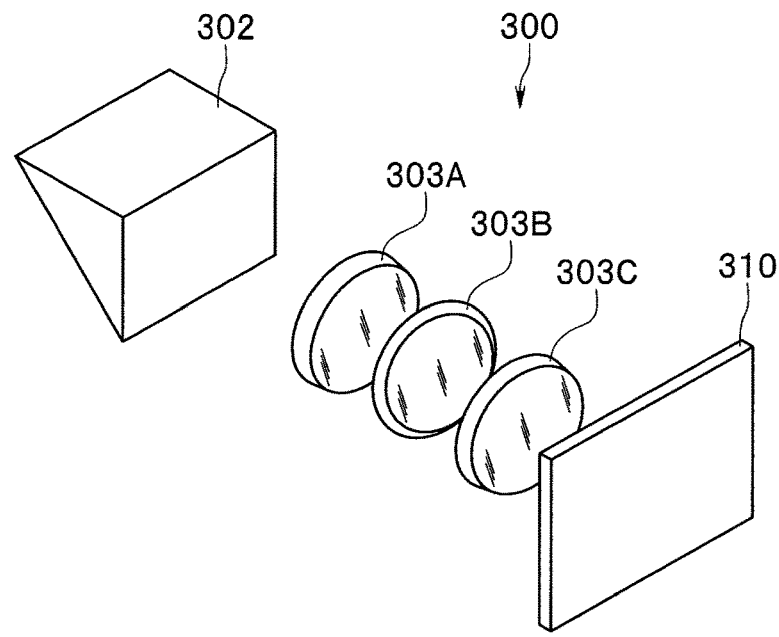
FIG. 12 is a perspective view showing a lens module including a position detection device according to the first embodiment of the invention.
Figure 13:
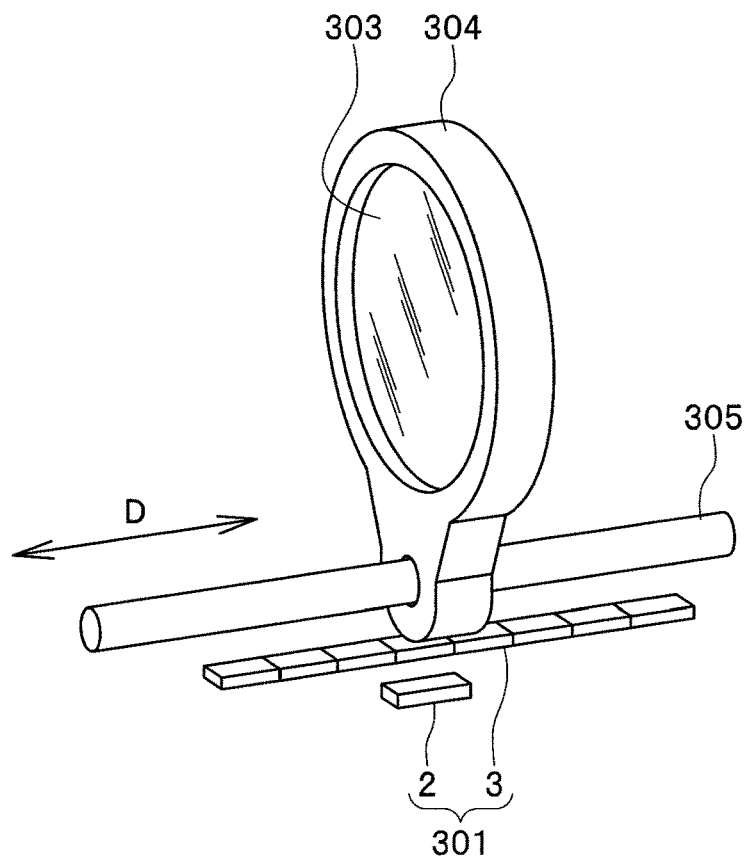
FIG. 13 is a perspective view showing the position detection device according to the first embodiment of the invention.

Next, a lens position detection device (hereinafter, referred to simply as a position detection device) according to the present embodiment will be described with reference to FIGS. 12 and 13. FIG. 12 is a perspective view showing a lens module including the position detection device according to the present embodiment. FIG. 13 is a perspective view showing the position detection device according to the present embodiment.

A lens module 300 shown in FIG. 12 constitutes a part of a smartphone camera, for example. The lens module 300 is used in combination with an image sensor 310 using a complementary metal-oxide-silicon (CMOS) sensor or the like. In the example shown in FIG. 12, the lens module 300 includes a triangular prism 302, and three lenses 303A, 303B, and 303C located between the image sensor 310 and the prism 302. At least one of the lenses 303A, 303B, and 303C is configured to be movable by a not-shown driving unit so that at least either focusing or zooming can be performed.

FIG. 13 shows a lens 303 among the lenses 303A, 303B, and 303C. The lens module 300 further includes a lens holder 304 that holds the lens 303, and a shaft 305. The lens module 300 can change the position of the lens 303 in an optical axis direction of the lens 303 by using the lens holder 304, the shaft 305, and the not-shown driving unit. In FIG. 13, the arrow denoted by the symbol D indicates the moving direction of the lens 303.

The lens module 300 further includes a position detection device 301 for detecting the position of the lens 303 whose position is variable. The position detection device 301 is used to detect the position of the lens 303 in performing focusing or zooming.

The position detection device 301 is a magnetic position detection device, and includes the magnetic sensor 2 according to the present embodiment and the magnetic field generator 3 of the present embodiment. In the lens module 300, the magnetic sensor 2 and the magnetic field generator 3 are configured so that the strength of the magnetic field component MFx (see FIG. 2) changes as the position of the lens 303 changes in the moving direction D. Specifically, the magnetic sensor 2 is fixed, and the magnetic field generator 3 is configured to be movable with the lens 303 in the moving direction D. The moving direction D is parallel to the X direction shown in FIGS. 1 and 2. When the position of the lens 303 changes, the position of the magnetic field generator 3 relative to the magnetic sensor 2 thus changes, and as a result, the strength of the magnetic field component MFx changes.

The position detection device 301 further includes the detection value generation circuit 4 of the present embodiment (see FIG. 4). The position detection device 301 generates a detection value Vs having a correspondence with the position of the lens 303 on the basis of the first and second detection signals S1 and S2 generated by the magnetic sensor 2. The position of the lens 303 has a correspondence with the position of the magnetic field generator 3 relative to the magnetic sensor 2. The method for generating the detection value Vs by the position detection device 301 is the same as the foregoing method for generating the detection value Vs.

Modification Examples

Figure 14:
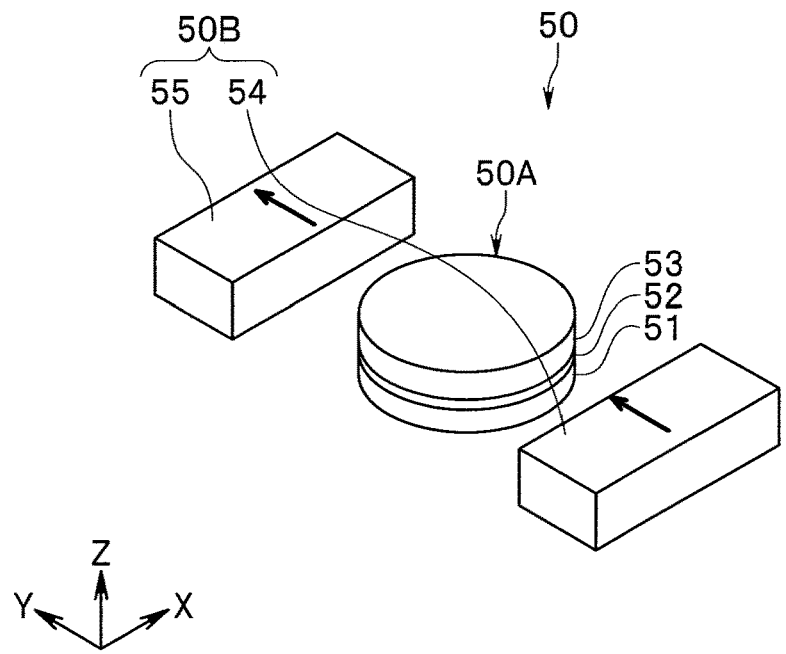
FIG. 14 is a perspective view showing a first modification example of a magnetoresistive element of the first embodiment of the invention.

Next, first to fifth modification examples of the MR element 50 of the present embodiment will be described. The first modification example of the MR element 50 will initially be described with reference to FIG. 14. The first modification example of the MR element 50 has basically the same configuration as that of the first example of the MR element 50 shown in FIG. 7. However, in the first modification example, the layered film 50A has a circular or substantially circular planar shape when viewed in the Z direction.

Figure 15:
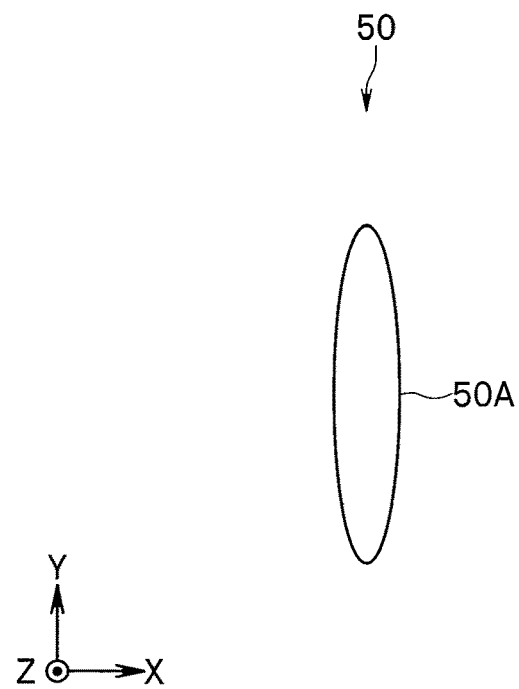
FIG. 15 is a plan view showing a second modification example of the magnetoresistive element of the first embodiment of the invention.

Next, the second modification example of the MR element 50 will be described with reference to FIG. 15. The second modification example is different from the first modification example in the following points. The second modification example does not include the bias magnetic field generator 50B. In the second modification example, the planar shape of the layered film 50A when viewed in the Z direction is an ellipse whose major axis direction intersects the direction parallel to the X direction. The free layer 53 of the MR element 50 has magnetic shape anisotropy with the direction of the easy axis of magnetization intersecting the X direction. In the example shown in FIG. 15, the direction of the easy axis of magnetization is parallel to the Y direction. The direction of the easy axis of magnetization may be oblique to the Y direction.

Figure 16:
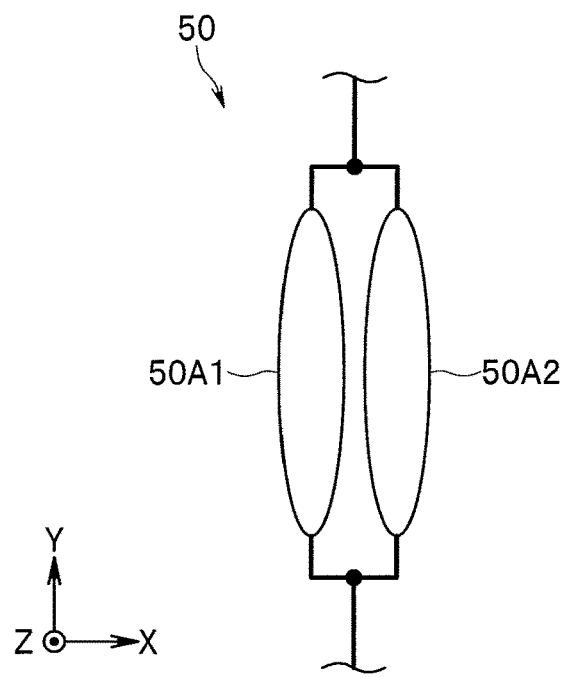
FIG. 16 is a plan view showing a third modification example of the magnetoresistive element of the first embodiment of the invention.

Next, the third modification example of the MR element 50 will be described with reference to FIG. 16. The third modification example is different from the second modification example in the following points. In the third modification example, the MR element 50 includes two layered films 50A1 and 50A2 instead of the layered film 50A according to the second modification example. The layered films 50A1 and 50A2 each have the same configuration and shape as those of the layered film 50A according to the second modification example. The layered films 50A1 and 50A2 are connected in parallel by electrodes to constitute a layered film pair. The layered film pair is connected to the layered film pair of another MR element 50 in series by an electrode. For example, the bottom surfaces of the respective layered films 50A1 and 50A2 are electrically connected to the bottom surfaces of the respective layered films 50A1 and 50A2 of another MR element 50 by a not-shown lower electrode. The top surfaces of the respective layered films 50A1 and 50A2 are electrically connected to the top surfaces of the respective layered films 50A1 and 50A2 of yet another MR element 50 by a not-shown upper electrode.

Figure 17:
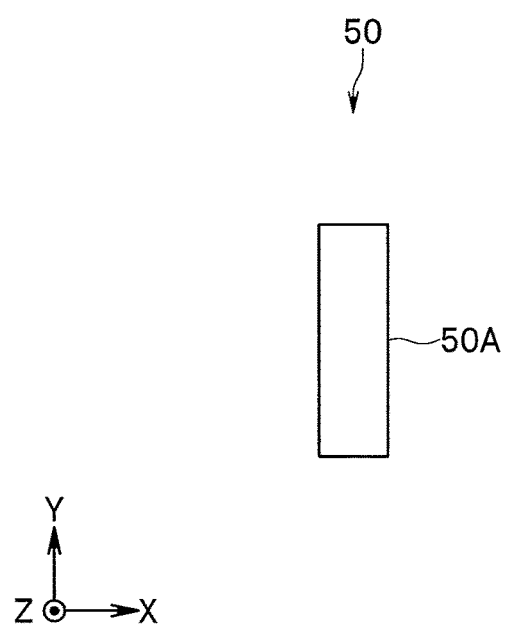
FIG. 17 is a plan view showing a fourth modification example of the magnetoresistive element of the first embodiment of the invention.
Figure 18:
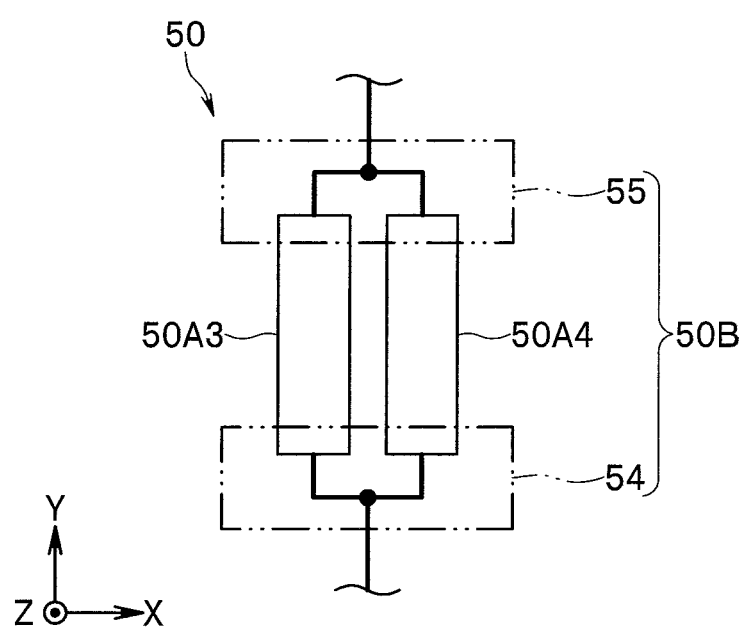
FIG. 18 is a plan view showing a fifth modification example of the magnetoresistive element of the first embodiment of the invention.

Next, the fourth modification example of the MR element 50 will be described with reference to FIG. 17. The fourth modification example is different from the second modification example in the following points. The planar shape of the layered film 50A when viewed in the Z direction is a rectangle whose longitudinal direction intersects the direction parallel to the X direction. The free layer 53 of the MR element 50 has magnetic shape anisotropy with the direction of the easy axis of magnetization intersecting the X direction. In the example shown in FIG. 17, the direction of the easy axis of magnetization is parallel to the Y direction. The direction of the easy axis of magnetization may be oblique to the Y direction.

Figure 19:
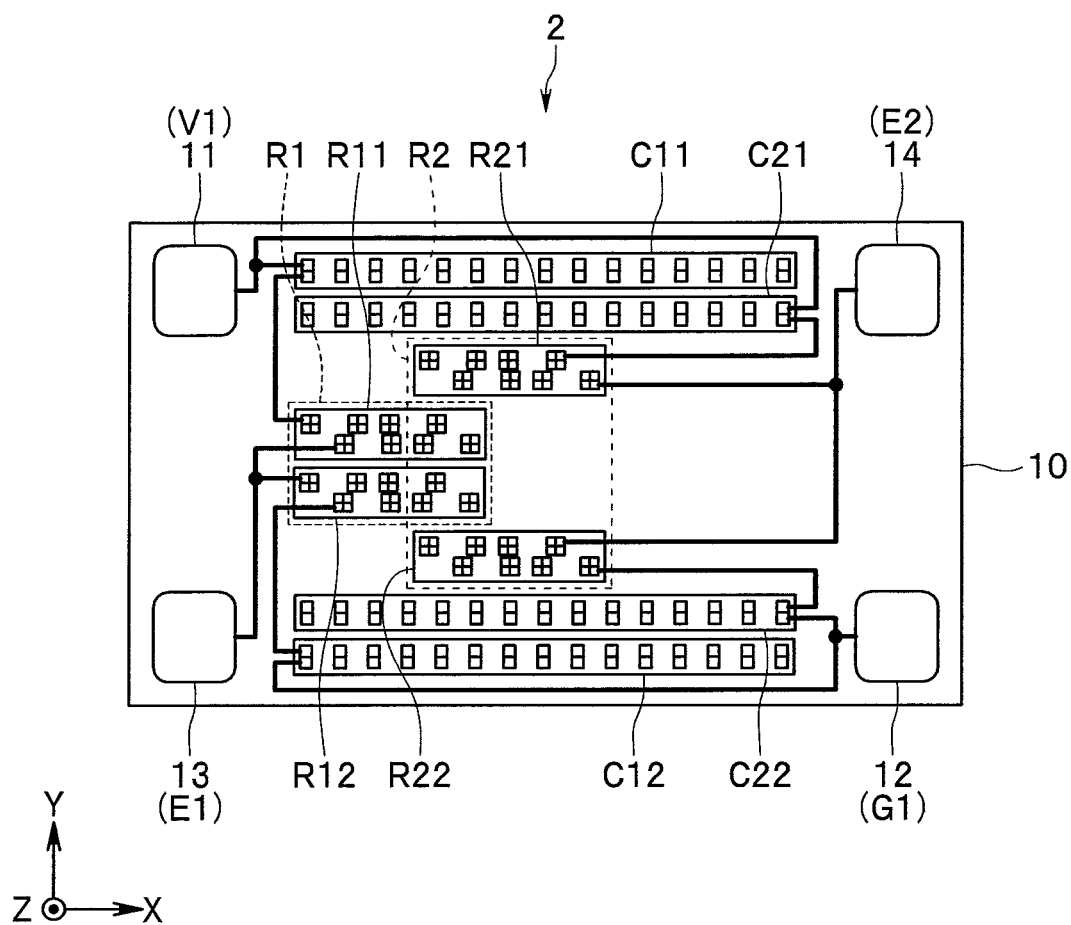
FIG. 19 is a plan view showing a magnetic sensor according to a second embodiment of the invention.

Next, the fifth modification example of the MR element 50 will be described with reference to FIG. 19. The fifth modification example is constituted by replacing the layered films 50A1 and 50A2 according to the third modification example with two layered films 50A3 and 50A4 having the same configuration and shape as those of the layered film 50A according to the fourth modification example. The layered films 50A3 and 50A4 are connected in parallel by electrodes to constitute a layered film pair. The layered film pair is connected to the layered film pair of another MR element 50 in series by an electrode. In addition, the fifth modification example includes the foregoing bias magnetic field generator 50B. Like the second example of the MR element 50 shown in FIG. 8, the magnets 54 and 55 of the bias magnetic field generator 50B are located at a position different from the layered films 50A3 and 50A4 are in the Z direction. When viewed in the Z direction, the magnets 54 and 55 are located to overlap the layered films 50A3 and 50A4.

Second Embodiment

A second embodiment of the present invention will now be described with reference to FIG. 19. FIG. 19 is a plan view showing a magnetic sensor according to the present embodiment.

In the present embodiment, the layout of the third and fourth correction resistors C21 and C22 is different from that in the first embodiment. More specifically, the reference element group 41 (see FIG. 6) of the third correction resistor C21 is located at the same or substantially the same position as each of the reference element group 41 of the first correction resistor C11 and the element group 31 (see FIG. 5) of the first resistor R11 is in the X direction. The reference element group 41 of the fourth correction resistor C22 is located at the same or substantially the same position as each of the reference element group 41 of the second correction resistor C12 and the element group 31 of the second resistor R12 is in the X direction.

In the present embodiment, the first to fourth correction resistors C11, C12, C21, and C22 are located at the same or substantially the same positions in the X direction. According to the present embodiment, the dimension of the magnetic sensor 2 in the X direction can thus be reduced.

The configuration, operation and effects of the present embodiment are otherwise the same as those of the first embodiment.

Third Embodiment

Figure 20:
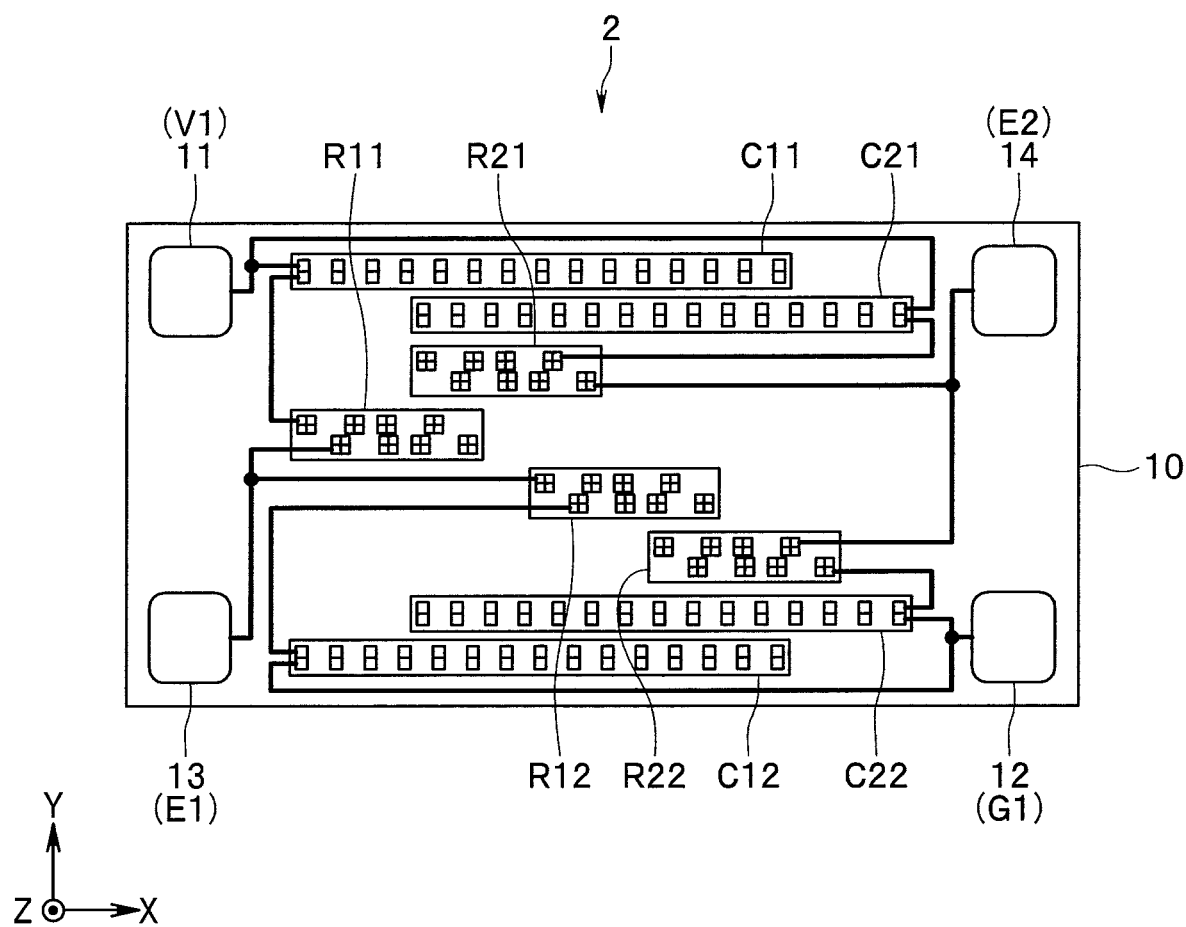
FIG. 20 is a plan view showing a magnetic sensor according to a third embodiment of the invention.

A third embodiment of the present invention will now be described with reference to FIG. 20. FIG. 20 is a plan view showing a magnetic sensor according to the present embodiment.

The magnetic sensor 2 according to the present embodiment differs from the magnetic sensor 1 according to the first embodiment in the following ways. In the present embodiment, the element group 31 (see FIG. 5) of the second resistor R12 is located Lp/2 away from the element group 31 of the first resistor R11 in the X direction. The element group 31 of the fourth resistor R22 is located Lp/2 away from the element group 31 of the third resistor R21 in the X direction.

In the present embodiment, the magnetization directions of the magnetization pinned layers in the respective plurality of MR elements 50 included in the second and fourth resistors R12 and R22 are the X direction. In other words, the magnetization direction of the magnetization pinned layer in each of the plurality of MR elements 50 of the second and fourth resistors R12 and R22 is the same as that of the magnetization pinned layer in each of the plurality of MR elements 50 of the first and third resistors R11 and R21. In the present embodiment, the magnetization directions of the magnetization pinned layers in the respective plurality of MR elements 50 included in the second and fourth correction resistors C12 and C22 are the −X direction.

The layout of the third and fourth correction resistors C21 and C22 may be the same as in the second embodiment. The configuration, operation and effects of the present embodiment are otherwise the same as those of the first or second embodiment.

Fourth Embodiment

Figure 21:
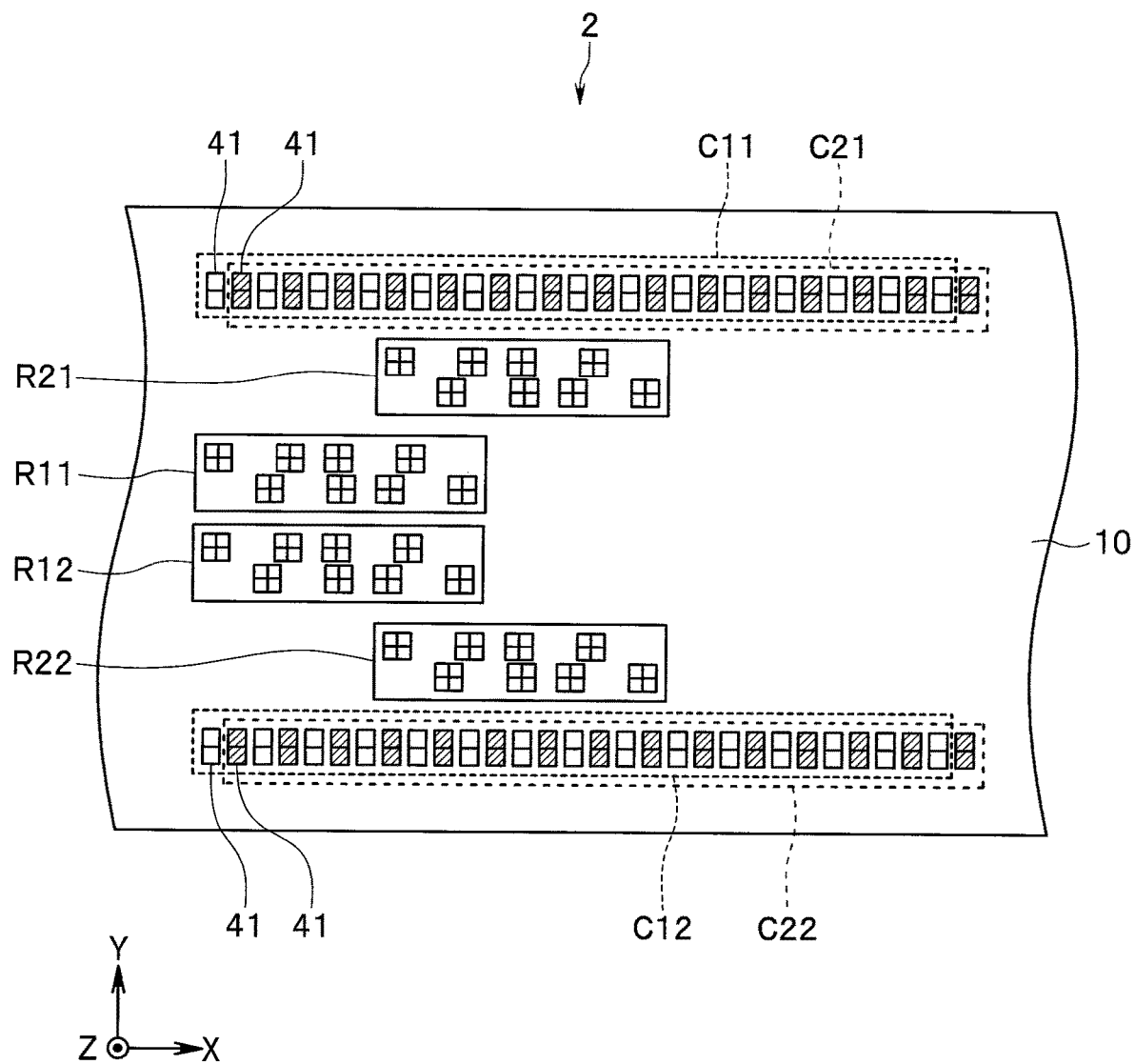
FIG. 21 is a plan view showing a part of a magnetic sensor according to a fourth embodiment of the invention.

A fourth embodiment of the present invention will now be described with reference to FIG. 21. FIG. 21 is a plan view showing a magnetic sensor according to the present embodiment.

In the present embodiment, the configuration of the first to fourth correction resistors C11, C12, C21, and C22 is different from that in the first embodiment. Specifically, in the present embodiment, the plurality of element groups 41 of the first correction resistor C11 and the plurality of element groups 41 of the third correction resistor C21 are alternately arranged in a row along the X direction. In FIG. 21, for ease of understanding, the plurality of element groups 41 of the third correction resistor C21 are shown with hatching.

Similarly, the plurality of element groups 41 of the second correction resistor C12 and the plurality of element groups 41 of the fourth correction resistor C22 are alternately arranged in a row along the X direction. In FIG. 21, for ease of understanding, the plurality of element groups 41 of the fourth correction resistor C22 are shown with hatching.

According to the present embodiment, the dimension of the magnetic sensor 2 in the Y direction can be reduced by configuring the first to fourth correction resistors C11, C12, C21, and C22 as described above.

The configuration of the second and fourth resistors R12 and R22 and the configuration of the second and fourth correction resistors C12 and C22 may be the same as in the third embodiment. The configuration, operation and effects of the present embodiment are otherwise the same as those of the first or third embodiment.

Fifth Embodiment

Figure 22:
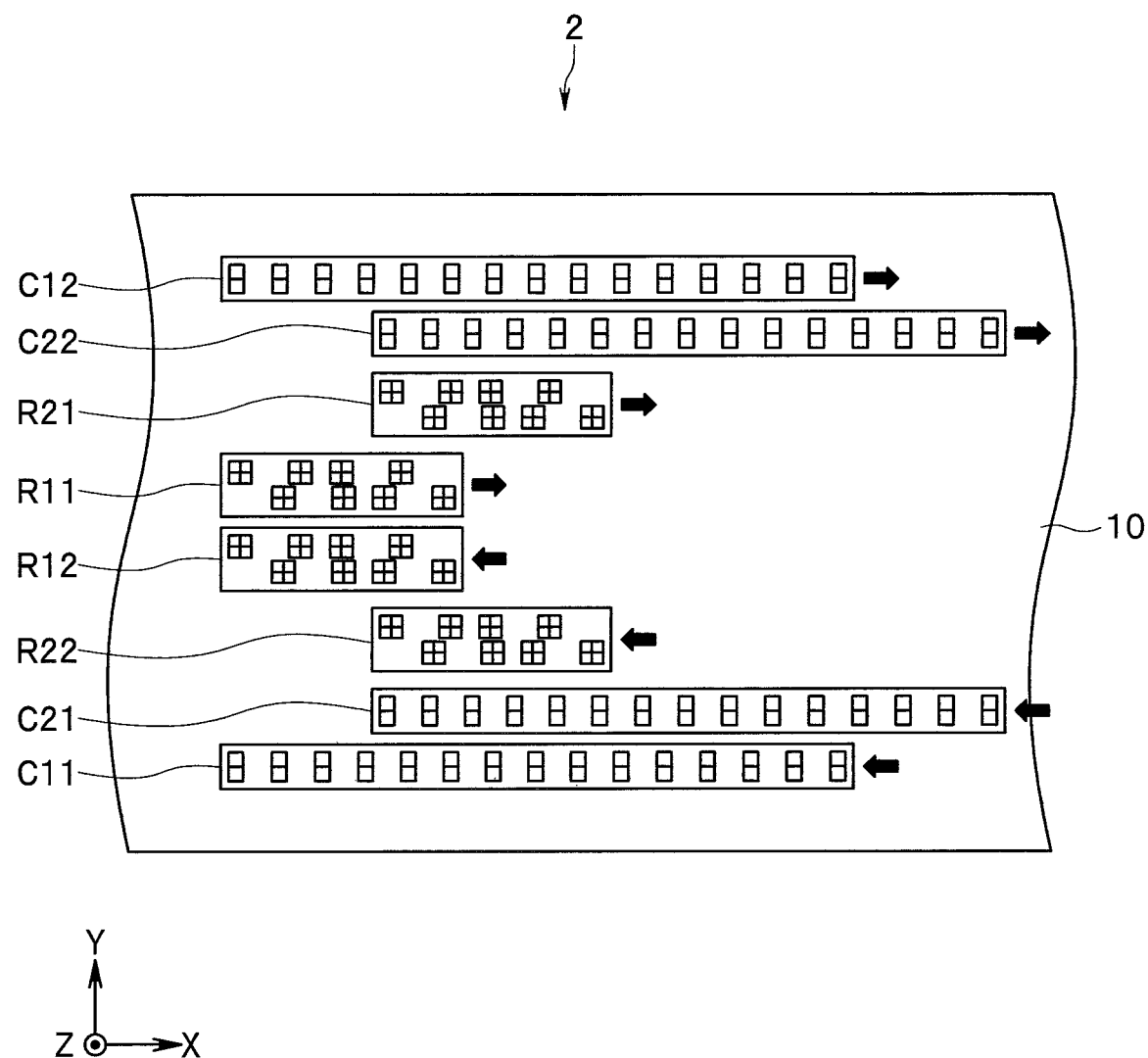
FIG. 22 is a plan view showing a part of a magnetic sensor according to a fifth embodiment of the invention.

A fifth embodiment of the present invention will now be described with reference to FIG. 22. FIG. 22 is a plan view showing a magnetic sensor according to the present embodiment.

In the present embodiment, the layout of the first to fourth correction resistors C11, C12, C21, and C22 is different from that in the first embodiment. Specifically, in the present embodiment, the first correction resistor C11 is located anterior to the fourth resistor R22 in the −Y direction. The third correction resistor C21 is located between the fourth resistor R22 and the first correction resistor C11.

The second correction resistor C12 is located anterior to the third resistor R21 in the Y direction. The fourth correction resistor C22 is located between the third resistor R21 and the second correction resistor C12.

In FIG. 22, the arrows near the first to fourth resistors R11, R12, R21, and R22 and the first to fourth correction resistors C11, C12, C21, and C22 indicate the magnetization directions of the magnetization pinned layers of the plurality of MR elements 50 included in the respective resistors. In the present embodiment, the first resistor R11, the third resistor R21, the second correction resistor C12, and the fourth correction resistor C22 in which the magnetization directions of the magnetization pinned layers of the MR elements 50 are the X direction are located on the Y direction side of the substrate 10. The second resistor R12, the fourth resistor R22, the first correction resistor C11, and the third correction resistor C21 in which the magnetization directions of the magnetization pinned layers of the MR elements 50 are the −X direction are located on the −Y direction side of the substrate 10.

The layout of the first to fourth correction resistors C11, C12, C21, and C22 other than in the Y direction and the layout of the first to fourth resistors R11, R12, R21, and R22 may be the same as those in any one of the second to fourth embodiments. The other configuration, function and effects of the present embodiment are the same as those of any of the first to fourth embodiments.

Sixth Embodiment

Figure 23:
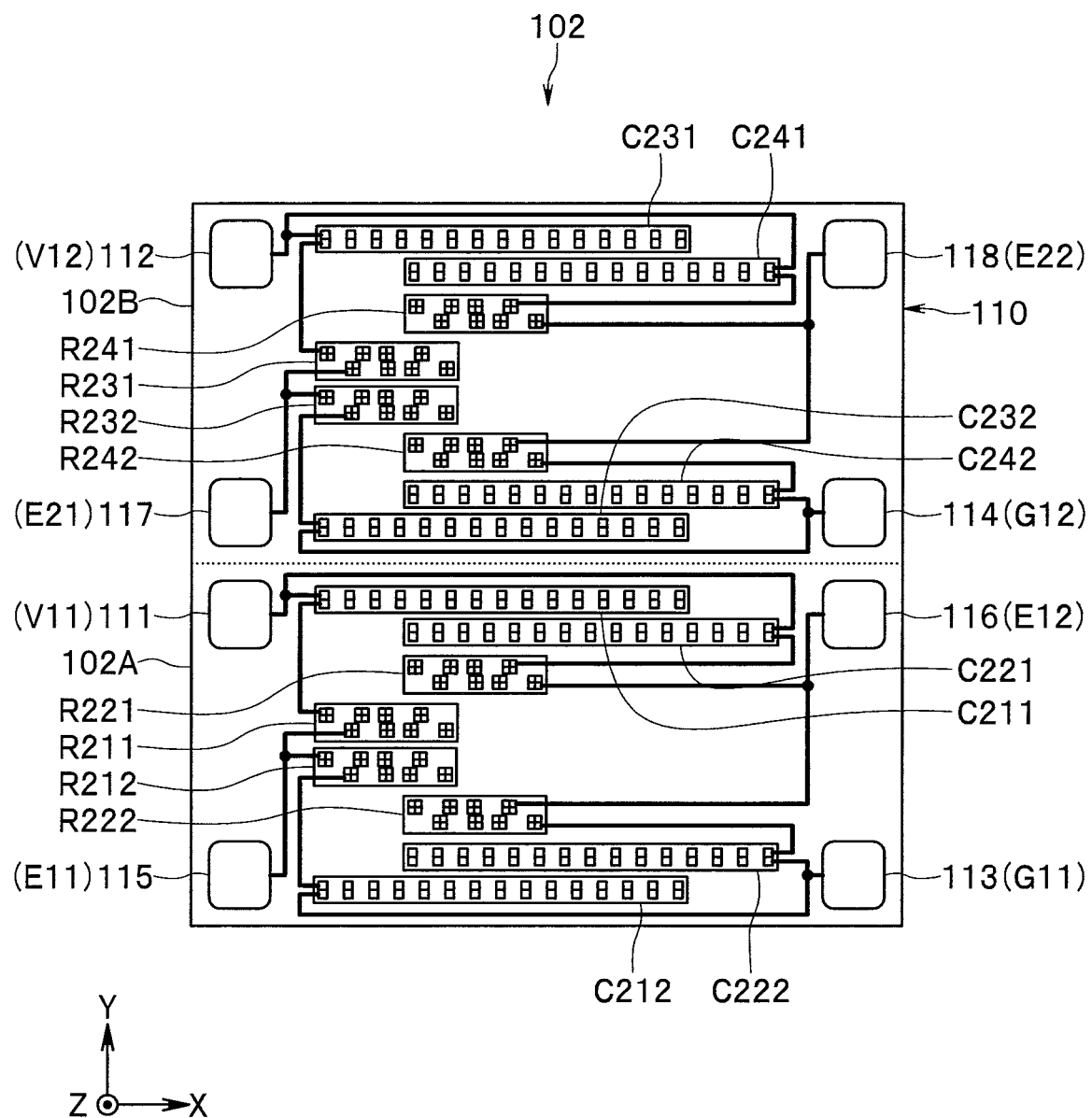
FIG. 23 is a plan view showing a magnetic sensor according to a sixth embodiment of the invention.
Figure 24:
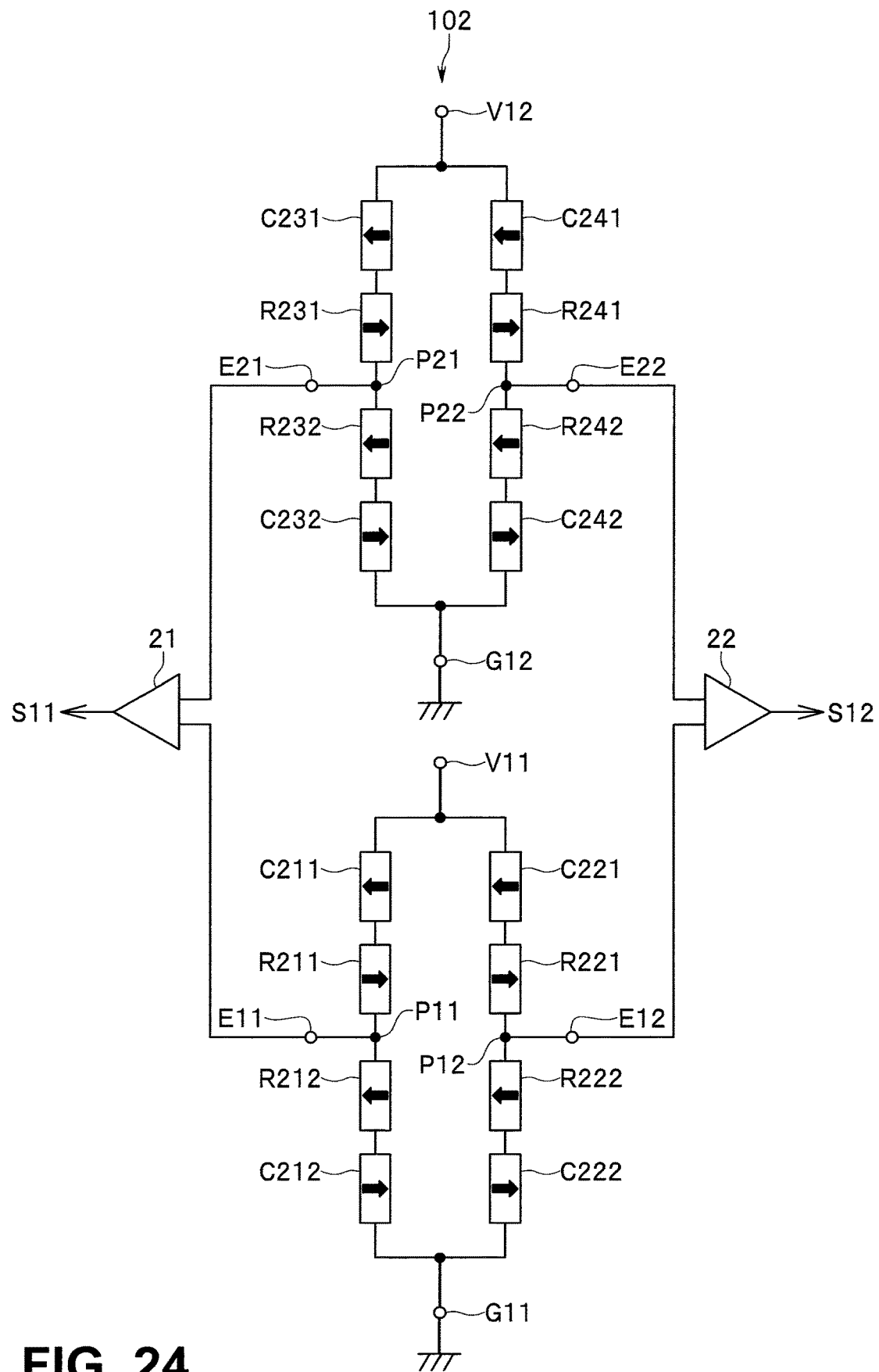
FIG. 24 is a circuit diagram showing a configuration of the magnetic sensor according to the sixth embodiment of the invention.

A sixth embodiment of the present invention will now be described with reference to FIGS. 23 and 24. FIG. 23 is a plan view showing a magnetic sensor according to the present embodiment. FIG. 24 is a circuit diagram showing the configuration of the magnetic sensor according to the present embodiment.

A magnetic sensor 102 according to the present embodiment includes a first resistor R211, a second resistor R212, a third resistor R221, a fourth resistor R222, a fifth resistor R231, a sixth resistor R232, a seventh resistor R241, and an eighth resistor R242 each configured to change periodically in resistance as the strength of the magnetic field component MFx (see FIG. 2) changes periodically. The first to eighth resistors R211, R212, R221, R222, R231, R232, R241, and R242 each include a plurality of MR elements 50. The first to eighth resistors R211, R212, R221, R222, R231, R232, R241, and R242 each include eight element groups 31 to 38 having the configuration and positional relationship shown in FIG. 5 in the first embodiment.

The magnetic sensor 102 further includes a first correction resistor C211, a second correction resistor C212, a third correction resistor C221, a fourth correction resistor C222, a fifth correction resistor C231, a sixth correction resistor C232, a seventh correction resistor C241, and an eighth correction resistor C242. The first to eighth correction resistors C211, C212, C221, C222, C231, C232, C241, and C242 each include a plurality of MR elements 50. The first to eighth correction resistors C211, C212, C221, C222, C231, C232, C241, and C242 each also include a plurality of element groups 41 having the configuration and positional relationship shown in FIG. 6 according to the first embodiment.

The magnetic sensor 102 further includes two power supply ports V11 and V12, two ground ports G11 and G12, a first output port E11, a second output port E12, a third output port E21, a fourth output port E22, and two differential detectors 21 and 22. A voltage of predetermined magnitude is applied to each of the power supply ports V11 and V12. The ground ports G11 and G12 are grounded. The magnetic sensor 102 may be driven by a constant voltage or driven by a constant current.

The power supply ports V11 and V12 correspond to a first port according to the present invention. The ground ports G11 and G12 correspond to a second port according to the present invention. The first to fourth output ports E11, E12, E21, and E22 correspond to a third port according to the present invention.

The differential detector 21 outputs a signal corresponding to a potential difference between the first and third output ports E11 and E21 as a first detection signal S11. The differential detector 22 outputs a signal corresponding to a potential difference between the second and fourth output ports E12 and E22 as a second detection signal S12.

The differential detectors 21 and 22 are connected to the detection value generation circuit 4 (see FIG. 4). In the present embodiment, the detection value generation circuit 4 generates the detection value Vs on the basis of the first and second detection signals S11 and S12. At least either the magnetic sensor 102 or the detection value generation circuit 4 may be configured to be able to correct the amplitude, phase, and offset of each of the first and second detection signals S11 and S12. The method for generating the detection value Vs is the same as that of the first embodiment except that the first and second detection signals S11 and S12 are used instead of the first and second detection signals S1 and S2.

As shown in FIG. 24, the first resistor R211 and the first correction resistor C211 are connected in series between the power supply port V11 and the first output port E11. The second resistor R212 and the second correction resistor C212 are connected in series between the ground port G11 and the first output port E11. The third resistor R221 and the third correction resistor C221 are connected in series between the power supply port V11 and the second output port E12. The fourth resistor R222 and the fourth correction resistor C222 are connected in series between the ground port G11 and the second output port E12.

The fifth resistor R231 and the fifth correction resistor C231 are connected in series between the power supply port V12 and the third output port E21. The sixth resistor R232 and the sixth correction resistor C232 are connected in series between the ground port G12 and the third output port E21. The seventh resistor R241 and the seventh correction resistor C241 are connected in series between the power supply port V12 and the fourth output port E22. The eighth resistor R242 and the eighth correction resistor C242 are connected in series between the ground port G12 and the fourth output port E22.

As shown in FIG. 24, the first resistor R211 and the second resistor R212 are connected in series via a first connection point P11 connected to the first output port E11. The third resistor R221 and the fourth resistor R222 are connected in series via a second connection point P12 connected to the second output port E12. The fifth resistor R231 and the sixth resistor R232 are connected in series via a third connection point P21 connected to the third output port E21. The seventh resistor R241 and the eighth resistor R242 are connected in series via a fourth connection point P22 connected to the fourth output port E22.

An end (end on the circuit diagram) of the first resistor R211 opposite to the first connection point P11 is connected to the first correction resistor C211. The first correction resistor C211 is connected to the power supply port V11.

An end (end on the circuit diagram) of the second resistor R212 opposite to the first connection point P11 is connected to the second correction resistor C212. The second correction resistor C212 is connected to the ground port G11.

An end (end on the circuit diagram) of the third resistor R221 opposite to the second connection point P12 is connected to the third correction resistor C221. The third correction resistor C221 is connected to the power supply port V11.

An end (end on the circuit diagram) of the fourth resistor R222 opposite to the second connection point P12 is connected to the fourth correction resistor C222. The fourth correction resistor C222 is connected to the ground port G11.

An end (end on the circuit diagram) of the fifth resistor R231 opposite to the third connection point P21 is connected to the fifth correction resistor C231. The fifth correction resistor C231 is connected to the power supply port V12.

An end (end on the circuit diagram) of the sixth resistor R232 opposite to the third connection point P21 is connected to the sixth correction resistor C232. The sixth correction resistor C232 is connected to the ground port G12.

An end (end on the circuit diagram) of the seventh resistor R241 opposite to the fourth connection point P22 is connected to the seventh correction resistor C241. The seventh correction resistor C241 is connected to the power supply port V12.

An end (end on the circuit diagram) of the eighth resistor R242 opposite to the fourth connection point P22 is connected to the eighth correction resistor C242. The eighth correction resistor C242 is connected to the ground port G12.

As shown in FIG. 23, the magnetic sensor 102 further includes a substrate 110, and two power supply terminals 111 and 112, two ground terminals 113 and 114, a first output terminal 115, a second output terminal 116, a third output terminal 117, and a fourth output terminal 118 that are located on the substrate 110. The power supply terminals 111 and 112 constitute the power supply ports V11 and V12, respectively. The ground terminals 113 and 114 constitute the ground ports G11 and G12, respectively. The first to fourth output terminals 115, 116, 117 and 118 constitute the first to fourth output ports E11, E12, E21, and E22, respectively.

As shown in FIG. 23, the magnetic sensor 102 is divided between a first portion 102A and a second portion 102B. In FIG. 23, the border between the first and second portions 102A and 102B is shown by a dotted line. The second portion 102B is located in front of the first portion 102A in the Y direction. The first portion 102A includes the first to fourth resistors R211, R212, R221, and R222, the first to fourth correction resistors C211, C212, C221, and C222, the power supply terminal 111, the ground terminal 113, and the first and second output terminals 115 and 116. The second portion 102B includes the fifth to eighth resistors R231, R232, R241, and R242, the fifth to eighth correction resistors C231, C232, C241, and C242, the power supply terminal 112, the ground terminal 114, and the third and fourth output terminals 117 and 118.

The layout of the first to fourth resistors R211, R212, R221, and R222 and the first to fourth correction resistors C211, C212, C221, and C222 in the first portion 102A is the same as that of the first to fourth resistors R11, R12, R21, and R22, and the first to fourth correction resistors C11, C12, C21, and C22 of the first embodiment. The layout of the fifth to eighth resistors R231, R232, R241, and R242, and the fifth to eighth correction resistors C231, C232, C241, and C242 in the second portion 102B is also the same as that of the first to fourth resistors R11, R12, R21, and R22, and the first to fourth correction resistors C11, C12, C21, and C22 of the first embodiment. In particular, in the present embodiment, the fifth and sixth resistors R231 and R232 are located at the same position as the first and second resistors R211 and R212 are in the X direction. The seventh and eighth resistors R241 and R242 are located at the same position as the third and fourth resistors R231 and R232 are in the X direction.

The configuration of the first to eighth resistors R211, R212, R221, R222, R231, R232, R241 and R242 described above makes a phase difference of the ideal component of the second detection signal S12 from the ideal component of the first detection signal S11 an odd number of times ¼ of a predetermined signal period (the signal period of the ideal component).

The configuration of the first to fourth resistors R211, R212, R221, and R222 and the first to fourth correction resistors C211, C212, C221, and C222, and the configuration of the fifth to eighth resistors R231, R232, R241, and R242, and the fifth to eighth correction resistors C231, C232, C241, and C242, may be the same as the configuration of the first to fourth resistors R11, R12, R21, and R22 and the first to fourth correction resistors C11, C12, C21, and C22 according to any one of the second to fifth embodiments. The other configuration, function and effects of the present embodiment are the same as those of any of the first to fifth embodiments.

The present invention is not limited to the foregoing embodiments, and various modifications may be made thereto. For example, the first to fourth correction resistors C11, C12, C21, and C22 may be located between the first and second resistors R11 and R12. Alternatively, the first correction resistor C11 may be located between the first and third resistors R11 and R21, and the second correction resistor C12 may be located between the second and fourth resistors R12 and R22.

The magnetic sensor according to the present invention may include a first and second common correction resistors instead of the first to fourth correction resistors C11, C12, C21, and C22. The first and second common correction resistors may each have the same configuration as that of each of the first to fourth correction resistors C11, C12, C21, and C22. In such a magnetic sensor, one end of the first common correction resistor is connected to the power supply port V1. The other end of the first common correction resistor is connected with an end of the first resistor R11 opposite to the first connection point P1 and an end of the third resistor R21 opposite to the second connection point P2. One end of the second common correction resistor is connected to the ground port G1. The other end of the second common correction resistor is connected with an end of the second resistor R12 opposite to the first connection point P1 and an end of the fourth resistor R22 opposite to the second connection point P2.

The number and layout of MR elements 50 are not limited to the examples described in the embodiments but may be freely set as long as the requirements set forth in the claims are satisfied.

The plurality of MR elements 50 of the first resistor R11 and the plurality of MR elements 50 of the second resistor R12 may be located at positions symmetrical about an imaginary straight line parallel to the X direction. The plurality of MR elements 50 of the third resistor R21 and the plurality of MR elements 50 of the fourth resistor R22 may be located at positions symmetrical about the imaginary straight line.

The magnetic field generator 3 may be a rotary scale magnetized to a plurality of pairs of N and S poles along the direction of rotation. The rotary scale may be a ring-shaped magnet, or a magnetic medium, such as a magnetic tape, fixed to a ring or a disc.

In the sixth embodiment, the first portion 102A and the second portion 102B may be separated. In the sixth embodiment, the resistors R211, R212, R231, and R232 may constitute a first Wheatstone bridge circuit, and the resistors R221, R222, R241, and R242 may constitute a second Wheatstone bridge circuit. In such a case, the first and second Wheatstone bridge circuits may be driven by a constant voltage or driven by a constant current.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A magnetic sensor for detecting a target magnetic field including a magnetic field component in a first direction and a noise magnetic field other than the target magnetic field, the magnetic sensor comprising:
    a first resistor having a first resistance;
    a first correction resistor having a second resistance;
    a first port; and
    a second port, wherein
    the first resistor and the first correction resistor are connected in series between the first port and the second port,
    the first resistor is configured so that the first resistance changes periodically as strength of the magnetic field component changes periodically, and
    the first correction resistor is configured so that a change in a sum of the first resistance and the second resistance due to the noise magnetic field is smaller than a change in the first resistance due to the noise magnetic field.

2. The magnetic sensor according to claim 1, wherein the first correction resistor is configured so that a change in the second resistance due to the magnetic field component is smaller than a change in the first resistance due to the magnetic field component.

3. The magnetic sensor according to claim 2, wherein the first correction resistor is configured so that the change in the second resistance due to the magnetic field component is zero.

4. The magnetic sensor according to claim 1, wherein:
    the first resistor and the first correction resistor each include a plurality of magnetoresistive elements;
    the plurality of magnetoresistive elements each include a magnetization pinned layer having a magnetization whose direction is fixed, a free layer having a magnetization whose direction is variable depending on the direction and strength of the magnetic field component, and a gap layer located between the magnetization pinned layer and the free layer;
    a direction of the magnetization of the magnetization pinned layer in each of the plurality of magnetoresistive elements of the first resistor is a first magnetization direction; and
    a direction of the magnetization of the magnetization pinned layer in each of the plurality of magnetoresistive elements of the first correction resistor is a second magnetization direction opposite to the first magnetization direction.

5. The magnetic sensor according to claim 4, wherein:
    the plurality of magnetoresistive elements of the first correction resistor are arranged in a row along the first direction at a predetermined interval; and
    a distance from a magnetoresistive element located at an end in the first direction to a magnetoresistive element located at the other end in the first direction among the plurality of magnetoresistive elements of the first correction resistor is a distance equivalent to one to ten periods of a change in the strength of the magnetic field component.

6. The magnetic sensor according to claim 4, wherein a number of the plurality of magnetoresistive elements of the first resistor is greater than or equal to a number of the plurality of magnetoresistive elements of the first correction resistor.

7. The magnetic sensor according to claim 4, wherein each of the plurality of magnetoresistive elements further includes a bias magnetic field generator that generates a bias magnetic field in a direction intersecting the first direction, the bias magnetic field being applied to the free layer.

8. The magnetic sensor according to claim 4, wherein the free layer has magnetic shape anisotropy with a direction of an easy axis of magnetization intersecting the first direction.

9. The magnetic sensor according to claim 4, wherein the gap layer is a tunnel barrier layer.

10. The magnetic sensor according to claim 1, further comprising:
    a second resistor having a third resistance;
    a second correction resistor having a fourth resistance; and
    a third port located between the first resistor and first correction resistor and the second port, wherein
    the second resistor and the second correction resistor are connected in series between the second port and the third port,
    the second resistor is configured so that the third resistance changes periodically as strength of the magnetic field component changes periodically, and so that a change in the third resistance has a phase different from a phase of a change in the first resistance, and
    the second correction resistor is configured so that a change in a sum of the third resistance and the fourth resistance due to the noise magnetic field is smaller than a change in the third resistance due to the noise magnetic field.

11. The magnetic sensor according to claim 1, wherein:
    the first port is a power supply port to which a voltage of predetermined magnitude is applied; and
    the second port is a ground port that is grounded.

12. A magnetic encoder comprising:
    the magnetic sensor according to claim 1; and
    a magnetic field generator that generates the target magnetic field, wherein
    the magnetic sensor and the magnetic field generator are configured so that the strength of the magnetic field component changes with a change in a position of the magnetic field generator relative to the magnetic sensor.

13. The magnetic encoder according to claim 12, further comprising a detection value generation circuit, wherein:
    the magnetic sensor generates at least one detection signal having a correspondence with the magnetic field component; and the detection value generation circuit generates a detection value having a correspondence with the position of the magnetic field generator relative to the magnetic sensor on a basis of the at least one detection signal.

14. The magnetic encoder according to claim 13, wherein:

the magnetic field generator is a magnetic scale including a plurality of pairs of N and S poles alternately arranged in a predetermined direction;

the at least one detection signal contains an ideal component varying periodically to trace an ideal sinusoidal curve, and an error component corresponding to a harmonic of the ideal component; and the first resistor is configured to reduce the error component.

15. A lens position detection device for detecting a position of a lens whose position is variable, the lens position detection device comprising:

the magnetic sensor according to claim 1; and a magnetic field generator that generates the target magnetic field, wherein the lens is configured to be movable in the first direction, and the magnetic sensor and the magnetic field generator are configured so that the strength of the magnetic field component changes with a change in the position of the lens.

16. The lens position detection device according to claim 15, further comprising a detection value generation circuit, wherein:

the magnetic sensor generates at least one detection signal having a correspondence with the magnetic field component; and the detection value generation circuit generates a detection value having a correspondence with the position of the lens on a basis of the at least one detection signal.

17. The lens position detection device according to claim 16, wherein:

the magnetic field generator is a magnetic scale including a plurality of pairs of N and S poles alternately arranged in a predetermined direction;

the at least one detection signal contains an ideal component varying periodically to trace an ideal sinusoidal curve, and an error component corresponding to a harmonic of the ideal component; and the first resistor is configured to reduce the error component.

* * * * *